United States Patent
Yamazaki

(10) Patent No.: US 8,088,669 B2
(45) Date of Patent: Jan. 3, 2012

(54) METHOD FOR MANUFACTURING SUBSTRATE OF SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 145 days.

(21) Appl. No.: 12/078,099

(22) Filed: Mar. 27, 2008

(65) Prior Publication Data

US 2008/0280420 A1 Nov. 13, 2008

(30) Foreign Application Priority Data

May 10, 2007 (JP) ................................ 2007-125192

(51) Int. Cl.
*H01L 21/30* (2006.01)
*H01L 21/46* (2006.01)

(52) U.S. Cl. ......... 438/458; 257/E21.122; 257/E21.568; 438/455; 438/459

(58) Field of Classification Search ........... 257/E21.122, 257/E21.568; 438/455, 458, 459
See application file for complete search history.

(56) References Cited

U.S. PATENT DOCUMENTS

| | | | |
|---|---|---|---|
| 4,731,516 A * | 3/1988 | Noguchi et al. ......... | 219/121.66 |
| 5,374,564 A | 12/1994 | Bruel | |
| 5,969,398 A * | 10/1999 | Murakami ..................... | 257/412 |
| 6,010,579 A * | 1/2000 | Henley et al. ................. | 148/33.2 |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,521,492 B2 * | 2/2003 | Miyasaka et al. ............. | 438/166 |
| 6,534,380 B1 | 3/2003 | Yamaguchi et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 7,119,365 B2 | 10/2006 | Takafuji et al. | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 2004/0104424 A1 | 6/2004 | Yamazaki | |
| 2005/0009252 A1 | 1/2005 | Yamazaki et al. | |
| 2006/0177993 A1* | 8/2006 | Endo et al. ..................... | 438/458 |
| 2007/0063281 A1 | 3/2007 | Takafuji et al. | |

(Continued)

FOREIGN PATENT DOCUMENTS

JP 11-097379 4/1999

(Continued)

*Primary Examiner* — Asok Sarkar
(74) *Attorney, Agent, or Firm* — Eric J. Robinson; Robinson Intellectual Property Law Office, P.C.

(57) ABSTRACT

A method for manufacturing a substrate of a semiconductor device is provided, which comprises a step of forming a fragile layer in a semiconductor substrate by irradiating the semiconductor substrate with ion species, a step of forming a bonding layer over the semiconductor substrate, a step of bonding the semiconductor substrate and a substrate having an insulating surface with the bonding layer interposed therebetween, a step of separating the semiconductor substrate with a semiconductor layer left over the substrate having the insulating surface by heating at least the semiconductor substrate, and a step of reprocessing the semiconductor substrate from which the semiconductor layer is separated.

22 Claims, 20 Drawing Sheets

U.S. PATENT DOCUMENTS

| | | |
|---|---|---|
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0216042 A1* | 9/2007 | Delprat et al. ........ 257/E21.324 |
| 2007/0291022 A1 | 12/2007 | Yamazaki et al. |
| 2008/0261376 A1 | 10/2008 | Yamazaki et al. |

FOREIGN PATENT DOCUMENTS

| | | |
|---|---|---|
| JP | 2004-087606 | 3/2004 |
| JP | 2005-252244 | 9/2005 |

* cited by examiner

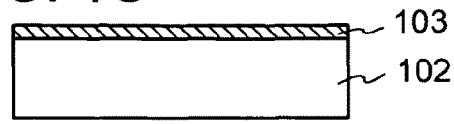
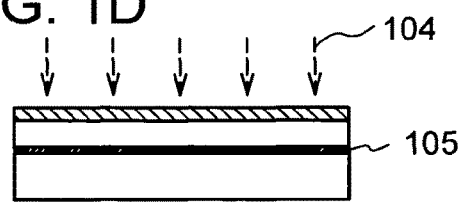
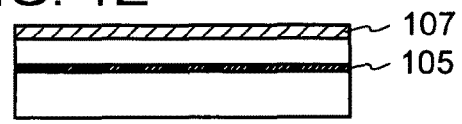
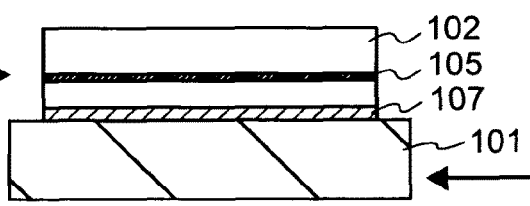
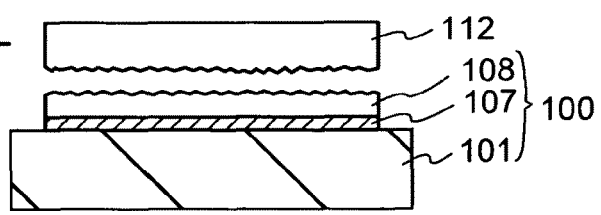
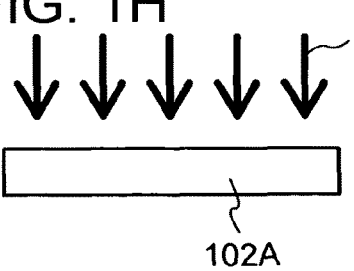
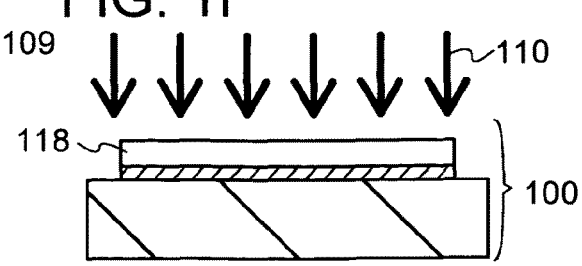

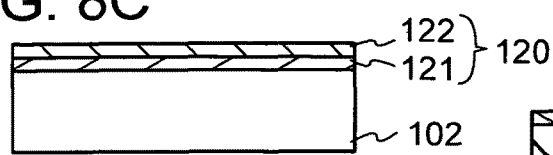
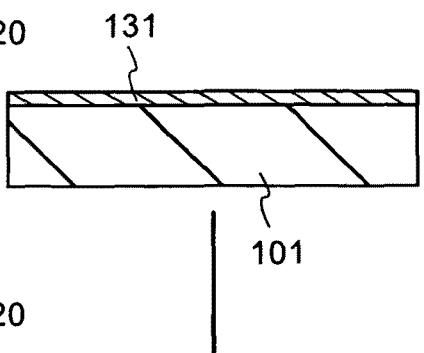
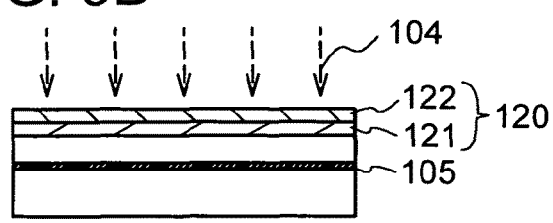
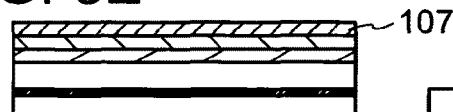
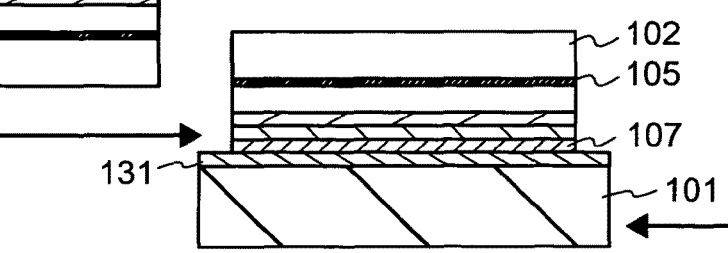
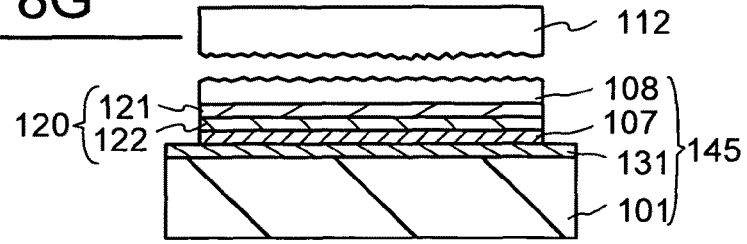
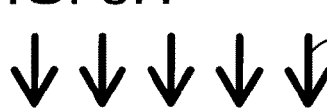
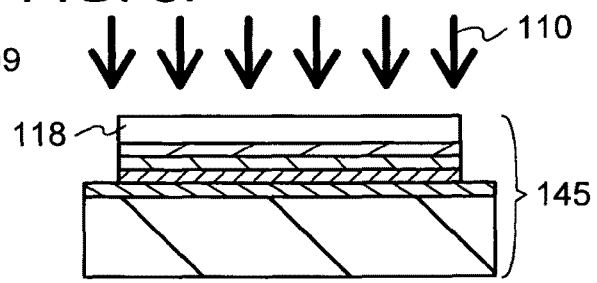

| Accelerating voltage | Ratio between Model 1 and Model 5 (X : Y) | Ratio between $H^+$ and $H_3^+$ (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

FIG. 20

METHOD FOR MANUFACTURING SUBSTRATE OF SEMICONDUCTOR DEVICE

BACKGROUND OF THE INVENTION

1. Field of the Invention

The present invention relates to a method for manufacturing a substrate including a semiconductor layer that is used for manufacture of a semiconductor device.

Note that a semiconductor device in the present specification generally indicates a device capable of functioning by utilizing semiconductor characteristics, and electro-optic devices, semiconductor circuits, and electronic devices are all semiconductor devices.

2. Description of the Related Art

Integrated circuits using an SOI (Silicon on Insulator) substrate where a thin single crystalline semiconductor layer is formed on an insulating surface, instead of a bulk-like silicon wafer, have been developed. Since parasitic capacitance between a drain of a transistor and a substrate is reduced by using the SOI substrate, the SOI substrate has been attracted attention as one improving performance of semiconductor integrated circuits.

A Smart Cut method is known as one of methods for manufacturing an SOI substrate. An outline method for manufacturing an SOI substrate by a Smart Cut method is described below. Hydrogen ions are implanted into a silicon wafer to form a microbubble layer at a predetermined depth from the surface. The silicon wafer into which the hydrogen ions are implanted is bonded to another silicon wafer with a silicon oxide film interposed therebetween. After that, by performing heat treatment, the microbubble layer is to be a cleavage plane, and the wafer into which the hydrogen ions are implanted is separated in a thin film state. A Smart Cut method may be referred to as a hydrogen ion implantation separation method.

An SOI substrate where a silicon layer separated from a silicon wafer is bonded to a glass substrate is known (see Reference 1: Japanese Published Patent Application No. H11-097379 and Reference 2: Japanese Published Patent Application No. 2005-252244). In Reference 1, a semiconductor substrate after the separation step is reused. After the silicon layer is separated from a single-crystal silicon substrate, the silicon layer bonded to a base substrate is planarized by mechanical polishing.

In Reference 2, after the separation step, a Si thin film bonded to a glass substrate is irradiated with laser light to be recrystallized, so that crystalline quality of the Si thin film is improved.

SUMMARY OF THE INVENTION

It is an object of the present invention to provide a reprocessing method for reuse of a semiconductor substrate from which a semiconductor layer is separated. It is another object of the present invention to provide a method for manufacturing a semiconductor substrate that has an SOI structure with the use of a substrate with the low upper temperature limit, such as a glass substrate which is utilized in manufacture of a liquid crystal panel.

A semiconductor substrate that includes a semiconductor layer of the present invention can be used for a substrate for manufacturing a semiconductor device. A substrate used for manufacture of a semiconductor device is referred to as a semiconductor substrate. In order to separate the semiconductor layer from the semiconductor substrate, a source gas containing one or more kinds of gases selected from a hydrogen gas, a rare gas, a halogen gas, and a halogen compound gas is excited to form ion species, and the ion species generated from the source gas is implanted into the semiconductor substrate, so that an ion implantation layer is formed in a region at a predetermined depth from a surface of the semiconductor substrate. The semiconductor substrate is heated, and a crack is formed in the ion implantation layer, whereby the semiconductor layer is separated from the semiconductor substrate.

The surface of the semiconductor substrate from which the semiconductor layer is separated has degraded planarity. In order to planarize the surface, the semiconductor substrate is irradiated with laser light from the surface side where the separation is performed. An upper layer of the semiconductor substrate is partially melted by irradiation with laser light, and the melted portion is cooled to be solidified, so that the surface where separation of the semiconductor substrate is performed is planarized; accordingly, it becomes possible to reuse the semiconductor substrate.

Further, after the semiconductor layer is separated, the semiconductor substrate is subjected to heat treatment, whereby an oxide film is formed. In this oxidizing step, defects in the semiconductor substrate are reduced, and the localized level density of the interface between the oxide film and the semiconductor substrate is reduced; therefore, the semiconductor substrate can be reused.

For example, a semiconductor substrate that is reprocessed can be used as a semiconductor substrate that is used for manufacture of a semiconductor device, such as an SOI substrate. Further, a semiconductor device such as an integrated circuit can be manufactured using the reprocessed semiconductor substrate.

In order to bond a base substrate of a substrate for manufacture of a semiconductor device and the semiconductor substrate, a bonding layer is provided, which smoothes depressions and projections of a surface of the semiconductor substrate and which has a hydrophilic surface. As the bonding layer, a silicon oxide film that is formed by a chemical vapor deposition (CVD) method using organic silane as a silicon source gas can be used. As an organic silane gas, an organic compound containing silicon can be employed, such as ethyl silicate (also referred to as tetraethoxysilane, abbr: TEOS, chemical formula: $Si(OC_2H_5)_4$), trimethylsilane (TMS: $(CH_3)_3SiH$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

When the reprocessing in which the semiconductor substrate is planarized is performed by irradiation with laser light, it becomes possible to reuse the semiconductor substrate, and resources can be utilized effectively. Further, when a semiconductor substrate is manufactured using the reprocessed semiconductor substrate, manufacture cost of the substrate can be reduced.

BRIEF DESCRIPTION OF THE DRAWINGS

FIGS. 1A to 1I are cross-sectional views illustrating a method for manufacturing a semiconductor substrate.

FIGS. 8A to 8I are cross-sectional views illustrating a method for manufacturing a semiconductor substrate.

FIG. 20 is a list of fitting parameters of the fitting function shown in FIGS. 18 and 19 (hydrogen element atom ratios and hydrogen ion species ratios).

DETAILED DESCRIPTION OF THE INVENTION

Figure 2A:
FIGS. 2A to 2C are cross-sectional views illustrating a reprocessing method of a semiconductor substrate (second substrate).

The present invention will be described below. Note that the present invention can be implemented in various modes, and it is easily understood by those skilled in the art that modes and details of the present invention can be modified in various ways without departing from the purpose and the scope of the present invention. Accordingly, the present invention should not be interpreted as being limited to the description of embodiment modes and an embodiment. Note that like portions in the drawings may be denoted by the like reference numerals in all drawings, and repetition explanation of materials, shapes, manufacturing methods, and the like is omitted.

Embodiment Mode 1

FIGS. 1A to 1I are cross-sectional views showing an example of a method for manufacturing a semiconductor substrate. An example of a method for manufacturing the substrate will be described with reference to FIGS. 1A to 1I.

As shown in FIG. 1A, a first substrate 101 that is to be a supporting substrate of a semiconductor substrate is prepared. A glass substrate (also referred to as "non-alkali glass") used in electronics industry, e.g., a liquid crystal display device can be used for the first substrate 101. Such an industrial glass substrate has thermal expansion coefficient of greater than or equal to $25 \times 10^{-7}/^\circ$ C. and less than or equal to $50 \times 10^{-7}/^\circ$ C. preferably, greater than or equal to $30 \times 10^{-7}/^\circ$ C. and less than or equal to $40 \times 10^{-7}/^\circ$ C.) and a strain point of greater than or equal to 580° C. and less than or equal to 680° C. (preferably greater than or equal to 600° C. and less than or equal to 680° C.). An industrial glass substrate having such characteristics includes, for example, a substrate made of glass material such as aluminosilicate glass, aluminoborosilicate glass, or barium borosilicate glass.

Further, instead of the glass substrate, the first substrate 101 can be an insulating substrate made of an insulating material, such as a ceramic substrate, a quartz substrate, or a sapphire substrate, a conductive substrate made of a conductive material such as metal or stainless, a semiconductor substrate made of a semiconductor such as silicon or gallium arsenic, or the like.

As shown in FIG. 1B, a second substrate 102 is prepared. The second substrate 102 is a semiconductor substrate. A semiconductor substrate is formed by bonding a semiconductor layer that is obtained by thinning the semiconductor substrate to the supporting substrate. A single crystalline semiconductor substrate is preferable for the semiconductor substrate that is to be the second substrate 102. A polycrystalline semiconductor substrate can be used. This semiconductor substrate can be a substrate made from an element belonging to Group 4 of the periodic table such as silicon, germanium, silicon-germanium, or silicon carbide. Further, the semiconductor substrate can be a substrate made of a compound semiconductor such as gallium arsenic or indium phosphide.

The second substrate 102 is washed. As shown in FIG. 1C, a protective film 103 is formed over the second substrate 102. The protective film 103 is formed in order to prevent the second substrate 102 from being contaminated with an impurity such as metal in a step of implanting ions for forming an ion implantation layer 105 and to prevent the second substrate 102 from being damaged by impacts of ions implanted. This protective film 103 can be formed by depositing an insulating material such as silicon oxide, silicon nitride film, a silicon nitride oxide film, or a silicon oxyitride film by a CVD method or the like. Further, the protective film 103 can be formed by thermal oxidation of the second substrate 102.

Note that in this specification, silicon oxynitride is a substance that contains more oxygen than nitrogen, which includes oxygen in the range of greater than or equal to 55 at./% and less than or equal to 65 at. %, nitrogen in the rage of 1 to 20 at. % or less, Si in the range of greater than or equal to 25 at. % and less than or equal to 35 at. %, and hydrogen in the range of greater than or equal to 0.1 at. % and less than or equal to 10 at. %. Further, silicon nitride oxide is a substance that contains more nitrogen than oxygen, which includes oxygen in the range of greater than or equal to 15 at. % and less than or equal to 30 at. %, nitrogen in the range of greater than or equal to 20 at. % and less than or equal to 35 at. %, Si in the range of greater than or equal to 25 at. % and less than or equal to 35 at. %, and hydrogen in the range of greater than or equal to 15 at. % and less than or equal to 25 at. %.

The silicon nitride oxide film can be formed using $SiH_4$, $N_2O$, and $NH_3$ as a process gas by a plasma CVD method. The silicon oxynitride film can be formed using $SiH_4$ and $N_2O$ as a process gas by a plasma CVD method.

Next, as shown in FIG. 1D, the second substrate 102 is irradiated with an ion beam 104 using ions accelerated in an electric field through the protective film 103, whereby ion species are implanted in a region at the predetermined depth from the surface of the second substrate 102, so that an ion implantation layer 105 is formed. The depth of the region where the ion implantation layer 105 is formed can be controlled by the accelerating energy of the ion beam 104 and the incidence angle thereof. The ion implantation layer 105 is formed in a region at the approximately same depth as average depth to which ions enter. This ion implantation step is a step of adding an element including ion species to the second substrate 102 by irradiating the second substrate 102 with the ion beam 104 using accelerated ion species. Therefore, the ion implantation layer 105 is a region where the element including ion species is added. Further, the ion implantation layer 105 is a layer that becomes fragile due to a broken crystal structure by impact of the accelerated ion species (fragile layer).

A thickness of the semiconductor layer that is separated from the second substrate 102 is determined in accordance with the depth of ion implantation. The thickness of the semiconductor layer that is separated from the second substrate 102 is greater than or equal to 5 nm and less than or equal to 500 nm, and the preferable range of the thickness is greater than or equal to 10 nm and less than or equal to 200 nm. The accelerating voltage of ions is adjusted by considering the depth of ion implantation.

In order to implant ions to the second substrate 102, an ion implantation apparatus can be used, by which ion species generated by excitation of a source gas are mass-separated and the ion species having the predetermined mass are implanted. Alternatively, an ion doping apparatus can be used, by which a plural kinds of ion species generated from a process gas are implanted without mass separation.

An ion implantation step in the case of using an ion doping apparatus can be performed under the following conditions: the accelerating voltage is greater than or equal to 10 kV and less than or equal to 100 kV (preferably, greater than or equal to 30 kV and less than or equal to 80 kV); the does is greater than or equal to $1 \times 10^{16}/cm^2$ and less than or equal to $4 \times 10^{16}/cm^2$; and the beam current density is 2 $\mu A/cm^2$ or more (preferably, 5 $\mu A/cm^2$ or more, more preferably, 10 $\mu A/cm^2$ or more).

A hydrogen gas can be used for a source gas in the ion implantation step. $H^+$, $H_2^+$, and $H_3^+$ are generated from a hydrogen gas ($H_2$ gas). When a hydrogen gas is used for a source gas, it is preferable that $H_3^+$ be most implanted into the second substrate 102. When $H_3^+$ ions are implanted, ion implantation efficiency is more improved than the case where $H^+$ and $H_2^+$ are implanted, and the implantation time can be shortened. In addition, a crack is easily formed in the ion implantation layer 105.

When the ion implantation apparatus is used, it is preferable to implant $H_3^+$, ions by mass separation. When the ion doping apparatus is used, it is preferably to contain $H_3^+$ ions of 70% or more with respect to the total amount of ion species of $H^+$, $H_2^+$, and $H_3^+$ in the ion beam 104. The proportion of $H_3^+$ ions is further preferably 80% or more. When the proportion of $H_3^+$ is increased, it is possible to contain hydrogen of $1 \times 10^{20}$ atoms/$cm^3$ or more in the ion implantation layer 105 by the ion doping apparatus. It is preferable that the ion implantation layer 105 contain hydrogen of $5 \times 10^{20}$ atoms/$cm^3$ or more. When a hydrogen implantation region at high concentration is locally formed in the second substrate 102, the crystal structure is damaged, and minute holes are formed, so that the ion implantation layer 105 has a porous structure. Therefore, volume of minute holes formed in the ion implantation layer 105 is changed by heat treatment at a relatively low temperature (600° C. or less), and the second substrate 102 can be cleaved along the ion implantation layer 105. Further, in order to form the ion implantation layer 105 in a shallow region from the surface of the second substrate 102, it is necessary to lower the accelerating voltage of ions. The proportion of $H_3^+$ ions in plasma generated by excitation of a hydrogen gas is increased, whereby atomic hydrogen (H) can be added to the second substrate 102 efficiently. This is because mass of $H_3^+$ ions is three times that of the $H_3^+$ ions; therefore, when one hydrogen atom is added at the same depth, the accelerating voltage of $H_3^+$ ions can be three times that of $H^+$ ions. If the accelerating voltage of ions can be increased, it is possible to shorten takt time of the ion implantation step, and productivity can be improved.

As the source gas in the ion implantation step, instead of a hydrogen gas, one or more kinds of gas selected from deuterium, a rare gas such as a helium gas or an argon gas, a halogen gas typified by a fluorine gas or a chlorine gas, and a halogen compound gas such as a fluorine compound gas (e.g., $BF_3$) can be used. When helium is used for a source gas, the ion beam 104 with high proportion of $He^+$ ions can be formed without mass separation. The second substrate 102 is irradiated with such an ion beam 104, whereby minute holes can be formed in the ion implantation layer 105 efficiently.

Further, by performing the ion implantation step plural times, the ion implantation layer 105 can be formed. In this case, the same process gas may be used in all ion implantation steps or difference process gases may be used for each ion implantation step. For example, ion implantation is performed first using a rare gas as a source gas. Next, an ion implantation step is performed using a hydrogen gas as a process gas. Alternatively, an ion implantation step is performed first using a halogen gas or a halogen compound gas, and the next ion implantation step is performed using a hydrogen gas.

After the ion implantation layer 105 is formed, the protective film 103 is removed by etching. Next, a bonding layer 107 is formed over the second substrate 102 where the protective film has been formed, as shown in FIG. 1E. The bonding layer 107 is for forming a smooth and hydrophilic bonding plane on the second substrate 102. Such a bonding layer 107 is preferably an insulating film formed by chemical reaction, and a silicon oxide film is preferable. The thickness of the silicon oxide film used for the bonding layer 107 can be greater than or equal to 10 nm and less than or equal to 200 nm. The preferable thickness is greater than or equal to 10 nm and less than or equal to 100 nm, and the more preferable thickness is greater than or equal to 20 nm and less than or equal to 50 nm.

In a step of forming the bonding layer 107, the heating temperature of the second substrate 102 is a temperature at which an element or molecule implanted into the ion implantation layer 105 is not diffused, and the heating temperature is preferably 350° C. or less. In other words, the heating temperature is a temperature at which degasification does not occur from the ion implantation layer 105. Accordingly, a CVD method, particularly, a plasma CVD method, is preferably used for forming the bonding layer 107. A higher temperature than the formation temperature of the bonding layer 107 is employed for the heat treatment temperature for separating a semiconductor layer 108 from the second substrate 102.

When the silicon oxide film of the bonding layer 107 is formed by a CVD method, organic silane is preferably used as a silicon source gas. An oxygen ($O_2$) gas can be used as an oxygen source gas. As an organic silane gas, the following can be employed, such as ethyl silicate (TEOS, chemical formula: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$). The bonding layer 107 can be formed using a silicon oxynitride film or a silicon nitride oxide film, instead of the silicon oxide film. The silicon oxynitride film can be formed by a plasma CVD method, for example, using $SiH_4$ and $N_2O$ as a process gas. The silicon nitride oxide film can be formed by a plasma CVD method, for example, using $SiH_4$, $N_2O$, and $NH_3$ as a process gas.

FIG. 1F is a cross-sectional view illustrating a bonding step, which shows a state in which the first substrate 101 and the second substrate 102 are bonded. For performing the bonding step, a surface of the first substrate 101 and a surface of the bonding layer 107, where a bonding interface is formed, are washed by a method such as ultrasonic cleaning. Then, the first substrate 101 and the bonding layer 107 are disposed in contact with each other. When the surface of the first substrate 101 and the surface of the bonding layer 107 are close to each other, Van der Waals force acts on an interface between these surfaces, and hydrogen bond is formed, so that the bonding layer 107 and the first substrate 101 are bonded. When a silicon oxide film formed by a CVD method using organic silane is used for the bonding layer 107, the first substrate 101 and the bonding layer 107 can be bonded at normal temperature without heating the first substrate 101 and the second substrate 102. Further, it becomes possible to use a glass substrate for the first substrate 101.

In order to make the bonding further strong, a method can be performed, for example, in which the surface of the first substrate 101 is subjected to oxygen plasma treatment or ozone treatment, so that the surface has a hydrophilic property. By this treatment, a hydroxyl group is added to the surface of the first substrate 101. Therefore, the hydroxyl group in the surface of the first substrate 101 acts, and the hydrogen bonding is formed in the bonding interface between the first substrate 101 and the bonding layer 107.

After the first substrate 101 and the bonding layer 107 are in contact with each other, heat treatment or pressure treatment is preferably performed. The bonding force between the first substrate 101 and the bonding layer 107 can be improved by performing heat treatment or pressure treatment. The temperature of heat treatment is preferably equal to or less than an upper temperature limit of the first substrate 101, and the heat temperature can be greater than or equal to 400° C. and less than or equal to 600° C. Pressure treatment is performed so that force is applied in a perpendicular direction to the bonding interface, and the added pressure is determined by considering strength of the first substrate 101 and the second substrate 102.

FIG. 1G is a cross-sectional view illustrating a separation step in which the semiconductor layer 108 is separated from the second substrate 102. In order to separate the semiconductor layer 108, after the first substrate 101 and the bonding layer 107 are bonded, heat treatment in which the second substrate 102 is heated is performed. The heating temperature of the second substrate 102 can be 400° C. or more and less than 600° C. The heating temperature of the second substrate 102 is preferably greater than or equal to a temperature of the second substrate 102 in forming the bonding layer 107.

By performing heat treatment in the temperature range of 400° C. or more and less than 600° C., volume change is generated in the minute holes formed in the ion implantation layer 105, and a crack is generated in the ion implantation layer 105. As a result, the second substrate 102 is cleaved along the ion implantation layer 105. Since the bonding layer 107 is bonded to the first substrate 101, the semiconductor layer 108 separated from the second substrate 102 is fixed over the first substrate 101. In addition, the bonding interface between the first substrate 101 and the bonding layer 107 is heated by this heat treatment, and covalent bonding with higher bonding force than the hydrogen bonding is formed in the bonding interface; therefore, the bonding force in the bonding interface can be improved. Reference numeral 112 denotes the second substrate from which the semiconductor layer 108 is separated.

In the separation step shown in FIG. 1G, a semiconductor substrate 100 in which the semiconductor layer 108 is provided for the first substrate 101 is formed. The semiconductor substrate 100 has a structure in which the bonding layer 107 is provided over the first substrate 101, and the semiconductor layer 108 and the bonding layer 107 are bonded to each other.

The second substrate 112 has a surface where the semiconductor layer 108 is separated. This surface is a plane where a crack is formed in the ion implantation layer 105. Thus, planarity of the surface of the second substrate 112 is damaged more than that of an upper surface of the second substrate 102, and depressions and projections are formed on the surface of the second substrate 112. Thus, reprocessing is performed so as to reuse the second substrate 112. As reprocessing, the second substrate 112 is irradiated with laser light 109 as shown in FIG. 1H, so that planarization treatment of the semiconductor substrate is performed.

FIG. 1H is a cross-sectional view illustrating the planarization treatment. As shown in FIG. 1H, the second substrate 112 is irradiated with the laser light 109 from the surface where the semiconductor layer 108 is separated, so that the second substrate 112 is partially melted. Reference numeral 102A denotes the second substrate 112 that is irradiated with the laser light 109. Note that "partial melting" here indicates that the second substrate has a melted portion and a solid portion. On the other hand, "complete melting" indicates that the second substrate is totally melted and in a liquid state. When the second substrate 112 is completely melted with laser light, there is a possibility in that crystallinity of the second substrate 102A is reduced.

The melted portion in the second substrate 102A with the laser light 109 is cooled and solidified, so that planarity thereof is improved. In addition, defects caused in the manufacture process of the semiconductor substrate 100 are reduced together with improvement in planarization by irradiation with the laser light 109, so that crystallinity of the second substrate 112 is improved.

A laser oscillating the laser light 109 may be a continuous wave laser, a pseudo continuous wave laser, or a pulsed laser. Such lasers include, for example, a gas laser such as an excimer laser like a KrF laser, an Ar laser, or a Kr laser; and a solid laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser. An excimer laser is a pulsed laser, and some solid lasers such as a YAG laser can be used as a continuous laser, a pseudo continuous laser, and a pulsed laser.

A wavelength of the laser light is a wavelength that is absorbed in the second substrate 112, which can be determined by considering the skin depth of the laser light and the like. For example, the wavelength can be in the range of greater or equal to 250 nm and less than or equal to 700 nm. In addition, the energy of the laser light can be determined in considering the wavelength of laser light, the skin depth of the laser beam, the thickness of the second substrate 112, and the like. The energy of laser light can be, for example, in the range of greater than or equal to 300 $mJ/cm^2$ and less than or equal to 800 $mJ/cm^2$. Irradiation with laser light can be performed in an atmosphere containing oxygen such as the atmospheric air or an inert atmosphere such as a nitrogen atmosphere. An inert atmosphere such as a nitrogen atmosphere can improve planarity of the second substrate 112 with higher effect than the atmospheric air, and can suppress generation of a crack with higher effect than the atmospheric air.

The second substrate 102A that is planarized by irradiation with the laser light 109 is reused for the second substrate 102 in FIG. 1B, whereby the semiconductor substrate 100 can be formed. Further, this second substrate 102A can be used for application other than formation of the semiconductor substrate 100, and a semiconductor device such as a semiconductor integrated circuit can be formed using the second substrate 102A.

When the semiconductor substrate 100 is formed using the reprocessed second substrate 102A, before the protective film 103 is formed, a step of removing an oxide film provided for the second substrate 102A by irradiation with the laser light 109 is performed by etching or the like as needed.

An upper surface of the semiconductor layer 108 provided with the semiconductor substrate 100 has damaged planarity as similar to the second substrate 112, and depressions and projections are formed. Thus, it is preferable to perform planarization treatment of the semiconductor layer 108 before a semiconductor device is formed using the semiconductor substrate 100. This planarization treatment can be performed by irradiating the semiconductor substrate 100 with laser light 110 from the semiconductor layer 108 side as shown in FIG. 1I. Irradiation of the semiconductor layer 108 with the laser light 110 can be performed similarly to the irradiation with the laser light 109 in FIG. 1H. Since the semiconductor layer 108 is partially to be melted, a laser oscillating the laser light 110 is preferably a pulsed laser such as an excimer laser.

By irradiation with the laser light 110, the upper surface of the semiconductor layer 108 is planarized, and defects are reduced, so that a semiconductor layer 118 with improved crystallinity can be formed. When a semiconductor device is formed using the semiconductor substrate 100 that includes such a semiconductor layer 118, variation in characteristics of a plurality of semiconductor elements can be suppressed. Since planarization of the semiconductor layer 108 is performed by irradiation with the laser light 110, mechanical polishing is difficult, and a glass substrate with low heat resistance can be used for the first substrate 101.

A semiconductor substrate 100 in which a plurality of semiconductor layers 108 are fixed over one first substrate 101 can be formed. For example, by repeating the steps described with the use of FIGS. 1B to 1E plural times, a plurality of second substrates 102 in each which an ion implantation layer 105 is formed are prepared. Next, by repeating the bonding step of FIG. 1F plural times, the plurality of second substrates 102 are fixed to the one first substrate 101. Then, the heating step of FIG. 1G is performed, whereby each second substrate 102 is separated; thus, the semiconductor substrate 100 in which a plurality of semiconductor layers 108 are fixed over the first substrate 101 is formed. Then, as shown in FIG. 1I, the semiconductor substrate 100 is irradiated with the laser light 110, so that planarization of the plurality of semiconductor layers 108 is performed.

Embodiment Mode 2

Figure 2B:
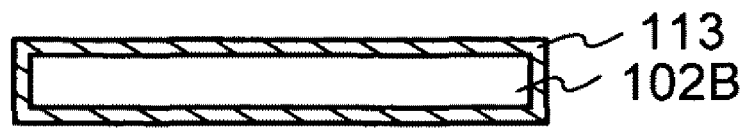

FIG. 2A is a cross-sectional view of the second substrate 112 after the separation step. In this embodiment mode, an example of reprocessing the second substrate 112 is described. First, the second substrate 112 is heated at a temperature of 700° C. or more to be oxidized, so that an oxide film 113 is formed as shown in FIG. 2B. FIG. 2B is a cross-sectional view illustrating a thermal oxidation step.

The temperature of thermal oxidation is preferably greater than or equal to 950° C. and less than or equal to 1100° C. Treatment time may be 0.1 to 6 hours, preferably 0.5 to 1 hour. The thickness of the oxide film 113 can be greater than or equal to 10 nm and less than or equal to 1000 nm, preferably greater than or equal to 40 nm and less than or equal to 200 nm. By thermal oxidation at such a high temperature, defects of the second substrate 112 are removed, so that a second substrate 102B with improved crystallinity can be formed. Further, the element or molecule implanted by the ion implantation step can be removed from the second substrate 112.

As the thermal oxidation treatment of FIG. 2B, dry oxidation treatment by which heat treatment is performed in a dry oxidation atmosphere at 100% can be applied. For example, a thermal oxidation atmosphere is preferably an oxygen atmosphere containing halogen, such as an oxygen atmosphere containing hydrochloric acid (HCl) at the concentration of greater than or equal to 0.5 vol/% and less than or equal to 10 vol/%. Note that concentration of halogen is preferably approximately 3 vol/%. In order for an oxygen atmosphere to contain halogen, instead of HCl, one or more kinds of gases selected from HF, $NF_3$, HBr, $Cl_2$, $ClF_3$, $BCl_3$, $F_2$, $Br_2$, trichloroethylene, dichloroethylene, and the like can be used.

By thermal oxidation treatment of the second substrate 112, in which the second substrate 112 is heated at a temperature of greater than or equal to 950° C. and less than or equal to 1100° C. and halogen is contained in the oxygen atmosphere, gettering treatment of the second substrate 112 can be performed. By using halogen, gettering of metal impurity in the second substrate 112 is effectively performed. In a case where hydrochloric acid is added to the atmosphere, an impurity such as metal becomes volatile chloride and diffused to a vapor phase to be removed by action of chlorine. Further, in this case, hydrogen is contained in an atmosphere, and the hydrogen in this atmosphere has function of compensating defects of an interface between the second substrate 102B and the oxide film 113 to reduce the localized level density of the interface.

By thermal oxidation treatment in the atmosphere containing halogen, halogen can be contained in the oxide film 113. When the concentration of halogen is greater than or equal to $1 \times 10^{17}/cm^3$ and less than or equal to $5 \times 10^{20}/cm^3$, the oxide film 113 functions as a gettering site capturing the impurity element to develop function as a protective film that prevents contamination of the second substrate 102B.

Figure 2C:
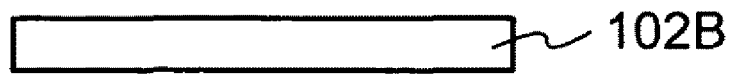

Next, etching treatment is performed, so that the oxide film 113 is removed from the second substrate 102B as shown in FIG. 2C. The semiconductor substrate 100 can be formed by reusing the second substrate 102B as the second substrate 102 of FIG. 1B.

Note that the second substrate 102B of FIG. 2B in a state where the oxide film 113 is not removed can be reused. In this case, the second substrate 102B provided with the oxide film 113 can be reused as the second substrate 102 on which the protective film 103 is formed of FIG. 1C.

Embodiment Mode 3

Figure 3A:
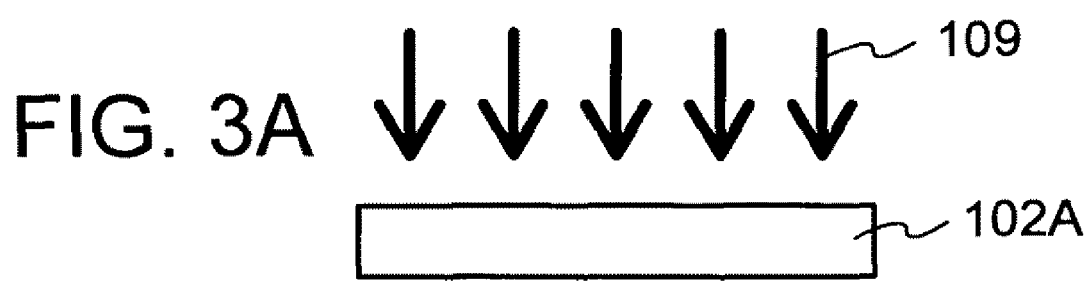
FIGS. 3A to 3C are cross-sectional views illustrating a reprocessing method of a semiconductor substrate (second substrate).
Figure 3B:
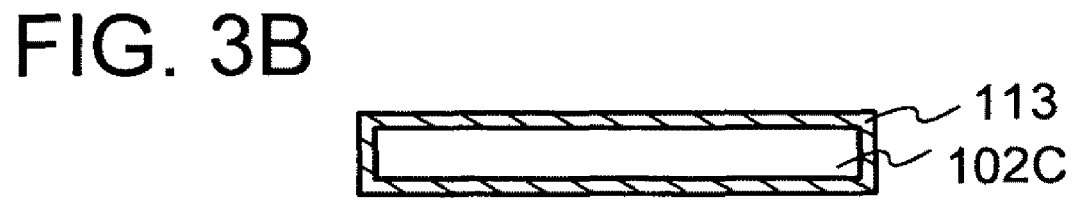
Figure 3C:

In this embodiment mode, an example of reprocessing the second substrate 112 is described. FIGS. 3A to 3C are diagrams for describing reprocessing.

First, as shown in FIG. 3A, the second substrate 112 is irradiated with laser light 109, similarly to Embodiment Mode 1, so that the second substrate 102A in which defects are reduced and planarity is improved is formed. Next, the second substrate 102A is heated at 700° C. or more to be oxidized, so that an oxide film 113 is formed as shown in FIG. 3B.

FIG. 3B is a cross-sectional view illustrating a thermal oxidation step. This thermal oxidation step can be performed similarly to the thermal oxidation step of FIG. 2B. By performing thermal oxidation treatment of FIG. 3B, defects are reduced, so that a second substrate 102C with the reduced interface state density between the oxide film 113 and the second substrate 102C is formed. Note that, a step of removing an oxide film, which is provided for the second substrate 102A by irradiation with the laser light 109, by etching or the like is performed as needed before the thermal oxidation treatment.

Next, as shown in FIG. 3C, etching treatment is performed to remove the oxide film 113 from the second substrate 102C. The semiconductor substrate 100 can be formed by reusing the second substrate 102C as the second substrate 102 of FIG. 1B.

The second substrate 102C of FIG. 3B in a state where the oxide film 113 is not removed can be reused. In this case, the second substrate 102C provided with the oxide film 113 can be reused as the second substrate 102 on which the protective film 103 is formed of FIG. 1C.

Embodiment Mode 4

In this embodiment mode, an example of reprocessing the second substrate 112 will be described. FIGS. 4A to 4D are diagrams for describing the reprocessing.

Figure 4A:
FIGS. 4A to 4D are cross-sectional views illustrating a reprocessing method of a semiconductor substrate (second substrate).
Figure 4B:
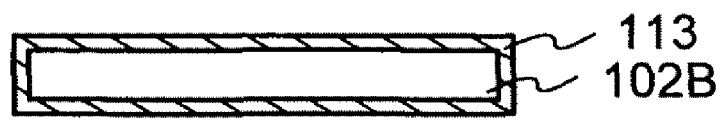
Figure 4C:
Figure 4D:
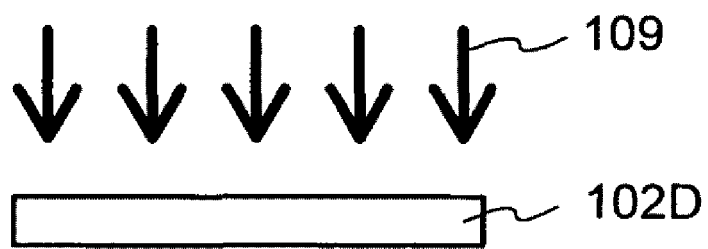

FIGS. 4A to 4C are cross-sectional views illustrating the same steps with the reprocessing in Embodiment Mode 2. First, the second substrate 102B from which the oxide film 113 is removed is formed by performing the steps described in Embodiment Mode 2. Next, as shown in FIG. 4D, the second substrate 102B is irradiated with laser light 109, so that a second substrate 102D is formed. The irradiation step with the laser light 109 of FIG. 4D can be performed similarly to the irradiation step with the laser light 109 of FIG. 1H. The purpose of the irradiation step with the laser light 109 is to further reduce defects in the second substrate 102B.

The semiconductor substrate 100 can be formed by reusing the second substrate 102D as the second substrate 102 of FIG. 1B. When the second substrate 102D is reused, an oxide film that is formed by irradiation with the laser light 109 of FIG. 4D is removed as needed.

Embodiment Mode 5

Figure 5A:
FIGS. 5A to 5D are cross-sectional views illustrating a reprocessing method of a semiconductor substrate (second substrate).
Figure 5B:
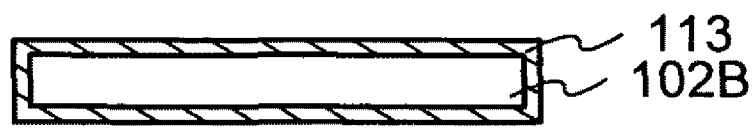

FIG. 5A is a cross-sectional view of the second substrate 112 after the separation step. In this embodiment mode, an example of reprocessing the second substrate 112 will be described. First, the second substrate 112 is heated at a temperature of 700° C. or more to be oxidized, so that an oxide film 113 is formed as shown in FIG. 5B. This thermal oxidation step can be performed similarly to the thermal oxidation step of FIG. 2B.

Figure 5C:
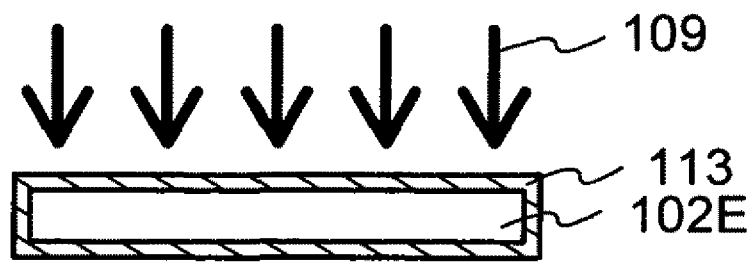

Next, as shown in FIG. 5C, the second substrate 102B provided with the oxide film 113 is irradiated with laser light 109. This irradiation step with laser light can be performed similarly to the irradiation step with laser light of FIG. 1H. The purpose of the irradiation step with the laser light 109 is to further reduce defects in the second substrate 102B, and as shown in FIG. 5C, a second substrate 102E irradiated with the laser light 109 is formed.

Figure 5D:

Next, etching treatment is performed, so that the oxide film 113 is removed from the second substrate 102E as shown in FIG. 5D. The semiconductor substrate 100 can be formed by reusing the second substrate 102E as the second substrate 102 of FIG. 1B.

Further, the second substrate 102E of FIG. 5C in a state where the oxide film 113 is not removed can be reused. In this case, the second substrate 102E provided with the oxide film 113 can be reused as the second substrate 102 of FIG. 1C on which the protective film 103 is formed.

In the step of FIG. 5C, the second substrate 102B is irradiated with the laser light 109 through the oxide film 113. Therefore, the thickness of the oxide film 113 is adjusted so as to function as an antireflection film and so that the laser light 109 is effectively absorbed into the second substrate 102B.

The thickness $d_{ox}$ of the oxide film 113 can be determined geometrically by the following formulas (1) and (2).

$$d_{ox} = \lambda/4n_{ox} \times (2m+1+\phi_1/2\pi) \pm D \quad \text{[Formula 1]}$$

$$\phi_1 = \tan^{-1}\{2n_{ox}k_s/(n_{ox}^2 - n_s^2 - k_s^2)\} \quad \text{[Formula 2]}$$

Each variable of the formulas (1) and (2) is as follows: $d_{ox}$ indicates thickness of the oxide film 113; $\lambda$ indicates wavelength of the laser light 109; $n_{ox}$ indicates refractive index of the oxide film 113; $n_s$ indicates refractive index of the second substrate 102B; $k_s$ indicates extinction coefficient of the second substrate 102B; $\phi_1$ indicates phase difference of the laser light 109 that is generated by reflection at the interface between the oxide film 113 and the second substrate 102B; m indicates integer number that is 0 or more; and D indicates correction value.

The correction value D of the formula (I) is a constant so as to have the thickness of the oxide film 113 uniformity, which can be $D \leq 10$ nm. For example, when the second substrate 102 is a single crystalline silicon substrate and the wavelength of the laser light 109 is 308 nm, the preferable range of the thickness of the oxide film 113 $d_{ox}$ is 48 nm±10 nm.

Embodiment Mode 6

FIGS. 6A to 6I are cross-sectional views illustrating an example of a method for manufacturing a semiconductor substrate. An example of a method for manufacturing this substrate will be described with reference to FIGS. 6A to 6I.

Figure 6B:
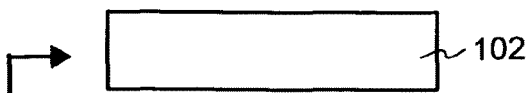
FIGS. 6A to 6I are cross-sectional views illustrating a method for manufacturing a semiconductor substrate.
Figure 6A:

As described with the use of FIG. 1A, a first substrate that is to be a supporting substrate of a semiconductor substrate is prepared (FIG. 6A). In addition, as described with the use of FIG. 1B, a second substrate 102 is prepared. FIG. 6B is a cross-sectional view of the second substrate 102.

Figure 6C:
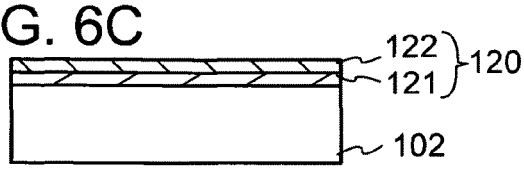

The second substrate 102 is washed. Then, as shown in FIG. 6C, a barrier layer 120 is formed over the second substrate 102. Even when a substrate including an impurity that makes reliability of a semiconductor device lower, such as alkali metal or alkaline earth metal, is used as the first substrate, formation of the barrier layer 120 can prevent such an impurity from diffusing into a semiconductor layer from the substrate. The barrier layer 120 includes at least one film having high effect of blocking alkali metal or alkaline earth metal. As such a film, a silicon nitride film, a silicon nitride oxide film, an aluminum nitride film, or the like can be given. The barrier layer 120 can be formed of a single film or a multi-layer film in which two or more films are stacked, and can also be formed of an insulating layer.

For example, when the barrier layer 120 is formed of one layer, the barrier layer can be formed of silicon nitride, silicon nitride oxide, or aluminum nitride. In the case of the barrier layer 120 having a two-layer structure, a layer formed in contact with the second substrate 102 is preferably a film that relieves stress so that internal stress of the other layer with high blocking effect does not act on the semiconductor layer. When the barrier layer 120 has a two-layer structure, for example, the following combinations can be given: a stacked film of a silicon oxide film and a silicon nitride film; a stacked film of a silicon oxynitride film and a silicon nitride film; a stacked film of a silicon oxide film and a silicon nitride oxide film; and a stacked film of a silicon oxynitride film and a silicon nitride oxide film. Note that in the above given two-layer structures, each of the former described films is formed over the second substrate 102 side (lower layer).

In this embodiment mode, the barrier layer 120 has a two-layer structure in which a lower layer is a silicon oxynitride film 121 formed by a plasma CVD method using $SiH_4$ and $N_2O$ as a process gas, and an upper layer is a silicon nitride oxide film 122 formed by a plasma CVD method using $SiH_4$ and $NH_3$ as a process gas.

Figure 6D:
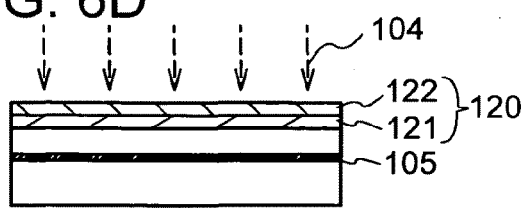

Next, as shown in FIG. 6D, the second substrate 102 is irradiated with an ion beam 104 including ions accelerated in an electric field through the barrier layer 120, so that an ion implantation layer 105 is formed in a region at the predetermined depth from a surface of the second substrate 102. This step can be performed similarly to formation of the ion implantation layer 105 described with the use of FIG. 1D. Formation of the barrier layer 120 can prevent the second substrate 102 from being contaminated by an impurity such as metal in an ion implantation step of forming the ion implantation layer 105, and the second substrate 102 can be prevented from being damaged by impact of implanted ions.

Figure 6E:
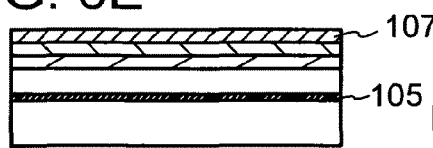

After the ion implantation layer 105 is formed, a bonding layer 107 is formed over the barrier layer 120 as shown in FIG. 6E. The bonding layer 107 can be formed by a similar method to the method for forming the bonding layer 107 described with the use of FIG. 1E. Here, a silicon oxide film formed by a plasma CVD method using oxygen and a TEOS gas as a process gas is used for the bonding layer 107.

Figure 6F:
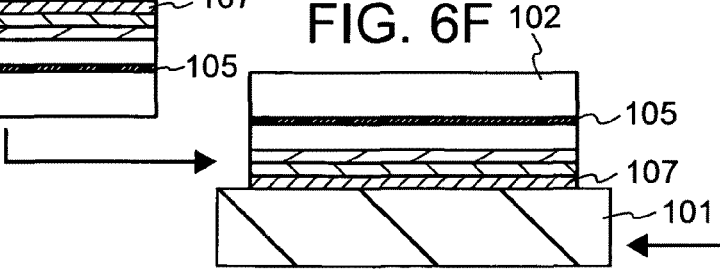

FIG. 6F is a cross-sectional view illustrating a bonding step, which shows a state in which the first substrate 101 and the second substrate 102 are bonded to each other. In order to bond the first substrate 101 and the second substrate 102, a surface of the first substrate 101 and a surface of the bonding layer 107, which form a bonding interface, are washed by ultrasonic washing or the like. Then, the first substrate 101 and the bonding layer 107 are disposed in contact with each other, similarly to the bonding step described with the use of FIG. 1F, so that the first substrate 101 and the bonding layer 107 are bonded to each other.

Before the first substrate 101 and the bonding layer 107 are bonded, the surface of the first substrate 101 may be subjected to oxygen plasma treatment or ozone treatment to have a hydrophilic property. Further, after the first substrate 101 and the bonding layer 107 are disposed in contact with each other, it is preferable to perform heat treatment or pressure treatment described in Embodiment Mode 1 so as to improve the bonding force.

Figure 6G:
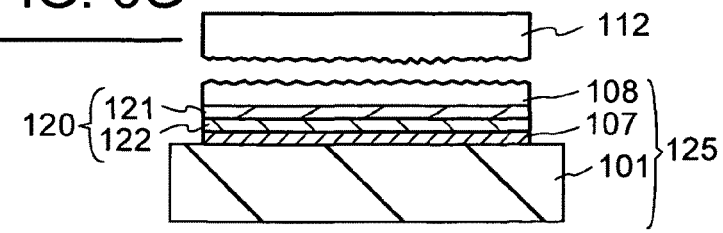

FIG. 6G is a cross-sectional view illustrating a separation step in which a semiconductor layer 108 is separated form the second substrate 102. The separation step of this embodiment mode can be performed similarly to the separation step described with the use of FIG. 1G. In order to separate the semiconductor layer 108, after the first substrate 101 and the bonding layer 107 are bonded, the second substrate 102 is heated at a temperature of 400° C. or more and less than 600° C. This heating temperature is preferably greater than or equal to a temperature of the second substrate 102 in formation of the bonding layer 107.

By the separation step shown in FIG. 6G, a semiconductor substrate 125 in which the semiconductor layer 108 is provided for the first substrate 101 is formed. The semiconductor substrate 125 has a multilayer structure in which the bonding layer 107, the barrier layer 120 including the silicon nitride oxide film 122 and the silicon oxynitride film 121, and the semiconductor layer 108 are stacked in this order over the first substrate 101. In the semiconductor substrate 125, the semiconductor layer 108 and the bonding layer 107 are bonded.

Figure 6H:
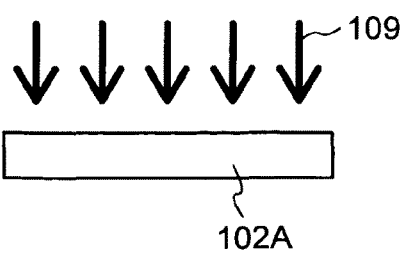

In order to reuse a separated second substrate 112 as the second substrate 102 of FIG. 6B, the second substrate 112 is irradiated with laser light 109 as shown in FIG. 6H to be partially melted, and planarization treatment is performed, so that a second substrate 102A is formed. This planarization treatment can be performed similarly to the planarization treatment described with the use of FIG. 1H. Note that the second substrate 102A can be used for application other than formation of the semiconductor substrate 125, and a semiconductor integrated circuit can be formed using the second substrate 102A.

Instead of reprocessing of FIG. 6H, the reprocessing described in Embodiment Modes 2 to 5 can be performed. The semiconductor substrate 125 can be formed by reusing the second substrate 102B, the second substrate 102C, the second substrate 102D, or the second substrate 102E.

Further, the second substrate 102B provided with the oxide film 113 of FIG. 2B and the second substrate 102C provided with the oxide film 113 of FIG. 3B can be used. In this case, a barrier layer 120 is formed over the oxide film 113 in the step of FIG. 6B.

Figure 6I:
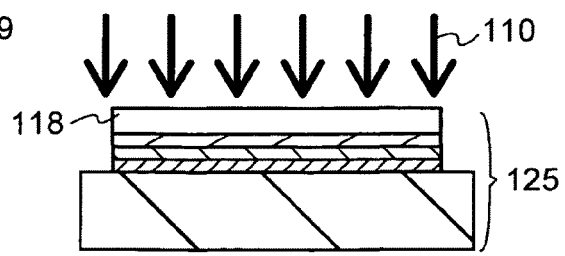

Also in this embodiment mode, the semiconductor substrate 125 is preferably irradiated with laser light 110 as shown in FIG. 6I. By irradiation with the laser light 110, an upper surface of the semiconductor layer 108 is planarized, and defects in the semiconductor layer 108 are reduced, so that a semiconductor layer 118 with improved crystallinity can be formed. When a semiconductor device is formed using the semiconductor substrate 125 including such a semiconductor layer 118, variation in characteristics of a plurality of semiconductor elements can be suppressed. Further, since planarization of the semiconductor layer 108 is performed by irradiation with the laser light 110, mechanical polishing is difficult, and a glass substrate with low heat resistance can be used as the first substrate 101.

A semiconductor substrate 125 in which a plurality of semiconductor layers 108 are fixed over one first substrate 101 can be formed. For example, by repeating the steps described with the use of FIGS. 6B to 6E plural times, a plurality of second substrates 102 in each which an ion implantation layer 105 is formed are prepared. Next, by performing the bonding step shown in FIG. 6F, the plurality of second substrates 102 are fixed to the first substrate 101. Then, by performing the heating step of FIG. 6G, each second substrate 102 is separated, so that the semiconductor substrate 125 in which a plurality of semiconductor layers 108 are fixed over the first substrate 101 can be formed. After that, the plurality of semiconductor layers 108 are irradiated with the laser light 110 as shown in FIG. 6I, so that planarization of the plurality of semiconductor layers 108 is performed.

Embodiment Mode 7

FIGS. 7A to 7I are cross-sectional views illustrating an example of a method for manufacturing a semiconductor substrate. An example of a method for manufacturing this substrate will be described with reference to FIGS. 7A to 7I.

As described with the use of FIG. 1A, a first substrate 101 that is to be a supporting substrate of a semiconductor substrate is prepared. As shown in FIG. 7A, a barrier layer 130 is formed over the substrate 101, and a bonding layer 131 is formed over the barrier layer 130.

Even when a substrate including an impurity that makes reliability of a semiconductor device lower, such as alkali metal or alkaline earth metal, is used for the substrate 101, formation of the barrier layer 130 can prevent such an impurity from diffusing into a semiconductor layer from the first substrate 101. The barrier layer 130 can be formed of one layer or a plurality of layers, and the thickness thereof can be greater than or equal to 10 nm and less than or equal to 400 nm. The barrier layer 130 includes at least one film having high effect of blocking alkali metal or alkaline earth metal. As such a film, a silicon nitride film, a silicon nitride oxide film, an aluminum nitride film, or the like can be given.

For example, when the barrier layer 130 is formed of one layer, the barrier layer 130 can be formed of silicon nitride, silicon nitride oxide, or aluminum nitride, each having a thickness of greater than or equal to 10 nm and less than or equal to 20 nm. When the barrier layer 120 has a two-layer structure, for example, the following combinations can be given: a stacked film of a silicon nitride film and a silicon oxide film; a stacked film of a silicon nitride film and a silicon oxynitride film; a stacked film of a silicon nitride oxide film and a silicon oxide film; and a stacked film of a silicon nitride oxide film and a silicon oxynitride film. Note that in the above given films having two-layer structure, each of the former described films is formed over an upper surface of the first substrate 101. In the barrier layer 130 having a two-layer structure, the upper layer is preferably a film that reduces stress so that internal stress of the lower layer with high blocking effect does not act on the semiconductor layer. The thickness of the upper layer can be greater than or equal to 10 nm and less than or equal to 200 nm, and the thickness of the lower layer can be greater than or equal to 10 nm and less than or equal to 200 nm.

Here, the barrier layer 130 has a two-layer structure, in which the lower layer is a silicon nitride oxide film formed by a plasma CVD method using $SiH_4$ and $NH_3$ as a process gas, and the upper layer is a silicon oxynitride film formed by a plasma CVD method using $SiH_4$ and $N_2O$ as a process gas.

The bonding layer 131 is formed using a material to be bonded to a bonding layer 107 provided for a second substrate 102. Therefore, the bonding layer 131 is preferably a film made of the same material with the bonding layer 107, and a silicon oxide film is preferable. Similarly to the bonding layer 107, the bonding layer 131 can also use a silicon oxide film formed by a CVD method using oxygen and an organic silane gas as a process gas. The thickness of the silicon oxide film used for the bonding layer 131 is greater than or equal to 10 nm and less than or equal to 200 nm, preferably greater than or equal to 10 nm and less than or equal to 100 nm, more preferably, greater than or equal to 20 nm and less than or equal to 50 nm. Note that a silicon oxide film can be used, which is formed using a gas different from organic silane, as a silicon source gas. The bonding layer 131 may be formed to be deposited in contact with the first substrate 101 without forming the barrier layer 130.

FIGS. 7B to 7E are cross-sectional views illustrating the same steps as FIGS. 1B to 1E, respectively. By performing the steps illustrated in FIGS. 7B to 7E, similarly to Embodiment Mode 1, a second substrate 102 over which a bonding layer 107 is formed and in which an ion implantation layer 105 is formed at a predetermined depth is prepared.

Figure 7B:
FIGS. 7A to 7I are cross-sectional views illustrating a method for manufacturing a semiconductor substrate.
Figure 7A:
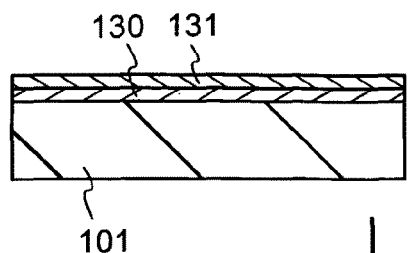
Figure 7C:
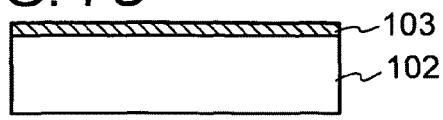
Figure 7D:
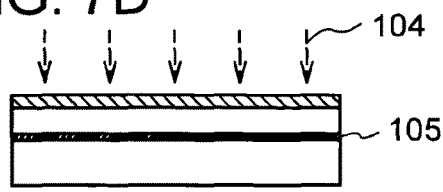
Figure 7E:
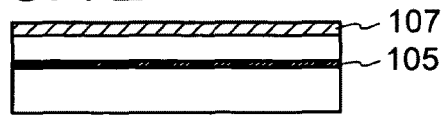
Figure 7F:
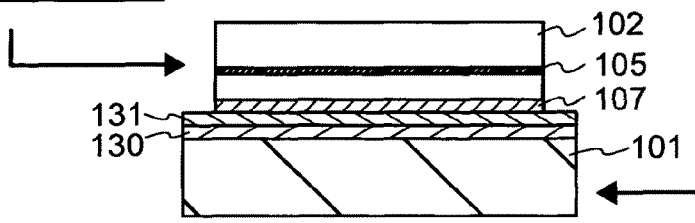

FIG. 7F is a cross-sectional view illustrating a bonding step, which shows a state in which the first substrate 101 and the second substrate 102 are bonded to each other. This step can be performed similarly to the bonding step of FIG. 1F.

First, a surface of the bonding layer 107 and a surface of the bonding layer 131, which form a bonding interface, are washed by ultrasonic washing or the like. Then, the bonding layer 131 over the first substrate 101 and the bonding layer 107 over the second substrate 102 are deposited in contact with each other, similarly to the bonding step described with the use of FIG. 1F, so that the bonding layer 131 and the bonding layer 107 are bonded to each other. The bonding layer 107 is formed of a silicon oxide film that is formed using organic silane as a silicon source gas, whereby the bonding layer 131 and the bonding layer 107 can be bonded at a normal temperature. After the bonding step, in order to improve the bonding force between the bonding layer 131 and the bonding layer 107, it is preferable to perform heat treatment or pressure treatment described in Embodiment Mode 1.

Figure 7G:
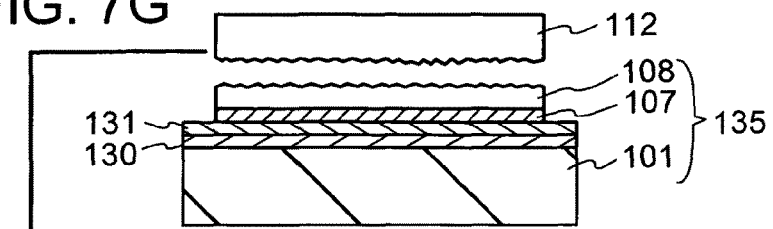

FIG. 7G is a cross-sectional view illustrating a separation step in which a semiconductor layer 108 is separated from the second substrate 102. The separation step of this embodiment mode can be performed similarly to the separation step described with the use of FIG. 1G. In order to separate the semiconductor layer 108, after the bonding layer 131 and the bonding layer 107 are bonded, the second substrate 102 is heated at a temperature of 400° C. or more and less than 600° C. The heating temperature is preferably greater than or equal to the temperature of the second substrate 102 in formation of the bonding layer 107.

By the separation step shown in FIG. 7G a semiconductor substrate 135 in which the semiconductor layer 108 is provided for the first substrate 101 is formed. This semiconductor substrate 135 has a multilayer structure in which the barrier layer 130 including the silicon nitride oxide film and the silicon oxynitride film, the bonding layer 131, the bonding layer 107, and the semiconductor layer 108 are stacked over the first substrate 101 in this order. In the semiconductor substrate 135, the bonding layer 131 and the bonding layer 107 are bonded to each other.

In order to reuse a separated second substrate 112 as the second substrate 102 of FIG. 7B, the second substrate 112 is irradiated with laser light 109 as shown in FIG. 7B to be partially melted, and planarization treatment is performed, so that a second substrate 102A is formed. This planarization treatment can be performed similarly to the planarization treatment described with the use of FIG. 1H. Note that the second substrate 102A can be used for application other than the formation of the semiconductor substrate 135, and a semiconductor integrated circuit can be formed using the second substrate 102A.

When the semiconductor substrate 135 is formed using the reprocessed second substrate 102A, a step of removing an oxide film, which is provided for the second substrate 102A by irradiation with the laser light 109, by etching or the like is performed as needed before the protective film 103 is formed. Further, as reprocessing, after irradiation with the laser light 109, polishing treatment in which a surface of the second substrate 102A is polished into the mirror surface can be performed by mechanical polishing or the like.

Figure 7H:
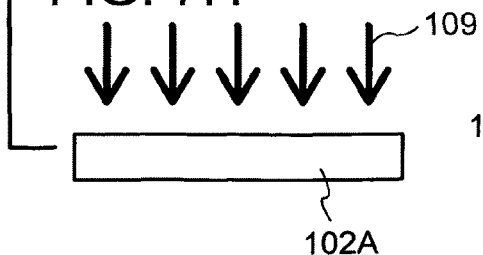

Instead of reprocessing of FIG. 7H, the reprocessing described in Embodiment Modes 2 to 5 can be performed. The semiconductor substrate 135 can be formed by reusing the second substrate 102B, the second substrate 102C, the second substrate 102D, or the second substrate 102E.

Further, the second substrate 102B provided with the oxide film 113 of FIG. 2B and the second substrate 102C provided with the oxide film 113 of FIG. 3B can be used. In this case, these substrates can be used as the second substrate 102 of FIG. 7C on which the protective film 103 is formed.

Figure 7I:
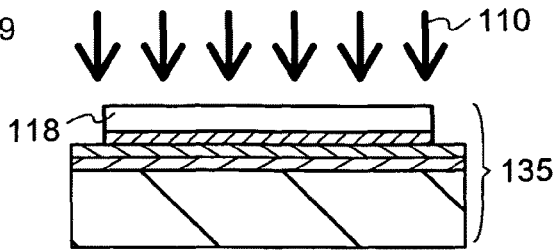

Also in this embodiment mode, it is preferable to irradiate the semiconductor substrate 135 with laser light 110 as shown in FIG. 7I. By irradiation with the laser light 110, an upper surface of the semiconductor layer 108 is planarized, and defects in the semiconductor layer 108 are reduced, so that a semiconductor layer 118 with improved crystallinity can be formed. When a semiconductor device is formed using the semiconductor substrate 135 including such a semiconductor layer 118, variation in characteristics of a plurality of semiconductor elements can be suppressed. Further, since planarization of the semiconductor layer 108 is performed by irradiation with the laser light 110, mechanical polishing is difficult, and a glass substrate with low heat resistance can be used as the substrate 101.

A semiconductor substrate 135 in which a plurality of semiconductor layers 108 are fixed over one first substrate 101 can be formed. For example, by repeating the steps described with the use of FIGS. 7B to 7E plural times, a plurality of second substrates 102 in each which an ion implantation layer 105 is formed are prepared. Next, by performing the bonding step shown in FIG. 7F, the plurality of second substrates are fixed to the first substrate. Then, by performing the heat treatment of FIG. 7G, each second substrate 102 is separated, so that the semiconductor substrate 135 in which a plurality of semiconductor layers 108 are fixed over the first substrate 101 is formed. After that, the plurality of semiconductor layers 108 are irradiated with the laser light 110 as shown in FIG. 7I, so that the plurality of semiconductor layers 108 are planarized.

Embodiment Mode 8

FIGS. 8A to 8I are cross-sectional views illustrating an example of a method for manufacturing a semiconductor substrate. An example of a method for manufacturing the semiconductor substrate will be described with reference to FIGS. 8A to 8I.

As described with the use of FIG. 1A, a first substrate that is to be a supporting substrate of a semiconductor substrate is prepared. As shown in FIG. 8A, a bonding layer 131 is formed over the first substrate 101. The bonding layer 131 can be formed similarly to the bonding layer 131 of FIG. 7A. Note that as similar to FIG. 7A, a barrier layer 130 may be formed over the first substrate, and the bonding layer 131 may be formed thereon.

FIGS. 8B to 8E are cross-sectional views illustrating the same steps of FIGS. 6B to 6E, respectively. The steps shown in FIGS. 8B to 8E are performed similarly to Embodiment Mode 6, so that a substrate 102 is prepared, on which a barrier layer 120 and a bonding layer 107 are stacked and in which an ion implantation layer 105 is formed in a region at a predetermined depth.

FIG. 8F is a cross-sectional view illustrating a bonding step, which shows a state in which the first substrate 101 and the second substrate 102 are bonded to each other. This step can be performed similarly to the bonding step of FIG. 7F, and the bonding layer 131 and the bonding layer 107 can be bonded at a normal temperature. After the bonding step, it is preferable to perform the heat treatment and the pressure treatment described in Embodiment Mode 1 in order to improve the bonding force between the bonding layer 131 and the bonding layer 107.

FIG. 8G is a cross-sectional view illustrating a separation step in which a semiconductor layer 108 is separated from the second substrate 102. The separation step of this embodiment mode can be performed similarly to the separation step described with the use of FIG. 1G. In order to separate the semiconductor layer 108, the second substrate 102 is heated at a temperature of 400° C. or more and less than 600° C. after the bonding layer 131 and the bonding layer 107 are bonded. This heating temperature is preferably the temperature or more of the second substrate 102 in forming the bonding layer 107.

By the separation step shown in FIG. 8G, a semiconductor substrate 145 in which the semiconductor layer 108 is provided for the first substrate 101 is formed. The semiconductor substrate 145 has a multilayer structure in which the bonding layer 131, the bonding layer 107, the barrier layer 130 including a silicon nitride film and a silicon oxynitride film, and the semiconductor layer 108 are stacked over the first substrate 101, and is a substrate in which the bonding layer 131 and the bonding layer 107 are bonded.

In order to reuse a separated second substrate 112 as the second substrate 102 of FIG. 8B, the second substrate 112 is irradiated with laser light 109 as shown in FIG. 8H. By irradiating the second substrate 112 with the laser light 109, the second substrate 112 is partially melted and planarized, so that a second substrate 102A is formed. This planarization treatment can be performed similarly to the planarization treatment described with the use of FIG. 1H. Note that the second substrate 102A can be used for application other than the formation of the semiconductor substrate 145, and a semiconductor device such as a semiconductor integrated circuit can be formed using the second substrate 102A.

In a case where the semiconductor substrate 145 is formed using the reprocessed second substrate 102A, a step of removing an oxide film, which is provided for the second substrate 102A by irradiation with the laser light 109, by etching or the like is performed as needed before the protective film 103 is formed. Further, as reprocessing, after irradiation with the laser light 109, polishing treatment in which a surface of the second substrate 102A is polished into the mirror surface can be performed by mechanical polishing or the like.

Instead of reprocessing of FIG. 8H, the reprocessing described in Embodiment Modes 2 to 5 can be performed. The semiconductor substrate 145 can be formed by reusing the second substrate 102B, the second substrate 102C, the second substrate 102D, or the second substrate 102E.

Further, the second substrate 102B provided with the oxide film 113 of FIG. 2B or the second substrate 102C provided with the oxide film 113 of FIG. 3B can be used. In this case, a barrier layer 120 is formed over the oxide film in the step of FIG. 8B.

Also, in this embodiment mode, it is preferable to irradiate the semiconductor substrate 145 with laser light 110 as shown in FIG. 8I. By irradiation with the laser light 110, an upper surface of the semiconductor layer 108 is planarized, and defects in the semiconductor layer 108 are reduced, so that a semiconductor layer 118 with improved crystallinity can be formed. When a semiconductor device is formed using the semiconductor substrate 145 including such a semiconductor layer 118, variation in characteristics of a plurality of semiconductor elements can be suppressed. Since planarization of the semiconductor layer 108 is performed by irradiation with the laser light 110, mechanical polishing is difficult, and a glass substrate with low heat resistance can be used for the first substrate 101.

A semiconductor substrate 145 in which a plurality of semiconductor layer 108 are fixed over one first substrate 101 can be formed. For example, by repeating the steps described with the use of FIGS. 8B to 8F plural times, a plurality of second substrates 102 in each which an ion implantation layer 105 is formed are prepared. Next, by performing the bonding step shown in FIG. 8F, the plurality of second substrates are fixed to the first substrate 101. Then, by performing the heating step of FIG. 8G, each second substrate 102 is separated, so that the semiconductor substrate 145 in which a plurality of semiconductor layers 108 are fixed over the first substrate 101 can be formed. After that, as shown in FIG. 8I, the plurality of semiconductor layers 108 are irradiated with the laser light 110, so that the plurality of semiconductor layers 108 are planarized.

Embodiment Mode 9

By each of the methods for manufacturing a semiconductor substrate described with reference to FIGS. 1A to 1I, FIGS. 6A to 6I, FIGS. 7A to 7I, and FIGS. 8A to 8I, the semiconductor layer 108 and the base substrate can be bonded strongly, even when the first substrate 101 is a glass substrate or the like with an upper temperature limit of 700° C. or less. Further, various kinds of glass substrates such as a non-alkaline glass substrate can be applied for the first substrate 101. Accordingly, by using a glass substrate as the first substrate 101, a semiconductor substrate with a large size in which one side is more than one meter can be manufactured. When a plurality of semiconductor elements are provided for such a large-sized semiconductor substrate, a liquid crystal display and an electroluminescent display can be manufactured. In addition to such display devices, various kinds of semiconductor devices such as a solar battery, a photo IC, and a semiconductor memory device can be manufactured.

Hereinafter, a method for manufacturing a semiconductor device using a semiconductor substrate will be described with reference to FIGS. 9A to 10B. Here, the semiconductor substrate 100 formed by the method of FIGS. 1A to 1I. Needless to say, semiconductor substrates having other structures can be also used.

Figure 9A:
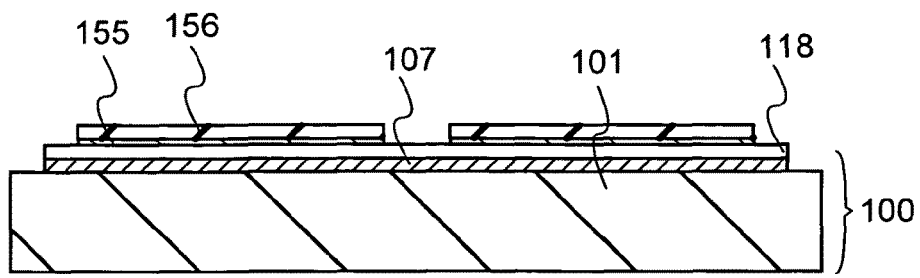
FIGS. 9A to 9E are cross-sectional views illustrating a method for manufacturing a semiconductor device using a semiconductor substrate.

As shown in FIG. 9A, the semiconductor layer 118 is provided over the first substrate 101 with the bonding layer 107 interposed therebetween. First, a silicon nitride layer 155 and a silicon oxide layer 156 are formed over the semiconductor layer 118 corresponding to an element formation region. The silicon oxide layer 156 is used as a hard mask in etching the semiconductor layer 118 for element separation. The silicon nitride layer 155 is used as an etching stopper in etching the semiconductor layer 118. Next, a p-type impurity such as boron, aluminum, or gallium, or an n-type impurity such as arsenic or phosphorus is added to the semiconductor layer 118 in order to control threshold voltage. For example, when boron is used as a p-type impurity, boron may be added at concentration of greater than or equal to $5 \times 10^{17}$ cm$^{-3}$ and less than or equal to $1 \times 10^{18}$ cm$^{-3}$.

Figure 9B:
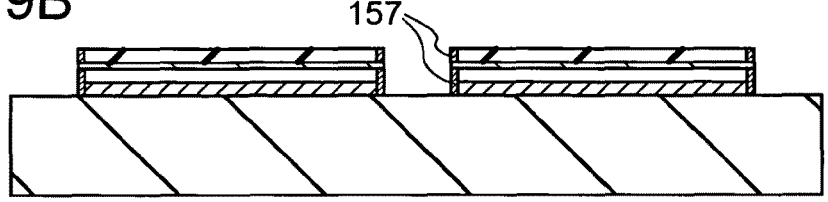

Next, as shown in FIG. 9B, the semiconductor layer 118 and the bonding layer 107 are etched using the silicon oxide layer 156 as a mask. Then, end faces of the exposed semiconductor layer 118 and the exposed bonding layer 107 by etching are nitrided by plasma treatment, so that nitride layers 157 are formed. By this nitride treatment, a silicon nitride layer is formed at least on a peripheral edge of the semiconductor layer 118. The silicon nitride layer has an insulating property and oxidation resistance. Therefore, by forming the silicon nitride layer, leak current from the end faces of the semiconductor layer 118 can be prevented, and a bird's beak can be prevented from being formed between the semiconductor layer 118 and the bonding layer 107 by growth of an oxide film from the end faces.

Figure 9C:
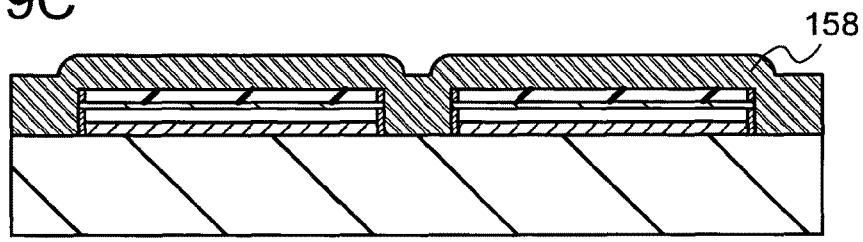

FIG. 9C is a cross-sectional view for describing a step of depositing an element separation insulating layer 158. The element separation insulating layer 158 is formed by depositing a silicon oxide film using TEOS and oxygen by a CVD method. As shown in FIG. 9C, the element separation insulating layer 158 is disposed thickly so as to fill a space between the semiconductor layers 118 with the element separation layer 158.

Figure 9D:
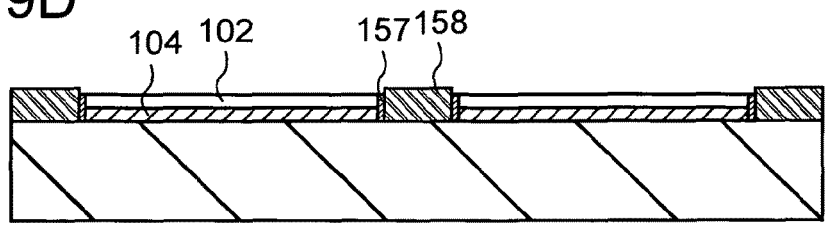

FIG. 9D shows a step of removing the element separation insulating layer 158 to expose the silicon nitride layer 155. This removing step can be performed by dry etching. At this time, the silicon nitride layer 155 functions as an etching stopper. The element separation insulating layer 158 is left so as to be embedded between the semiconductor layers 118. The silicon nitride layer 155 is thereafter removed. Note that this removing step can be performed by chemical mechanical polishing.

Figure 9E:
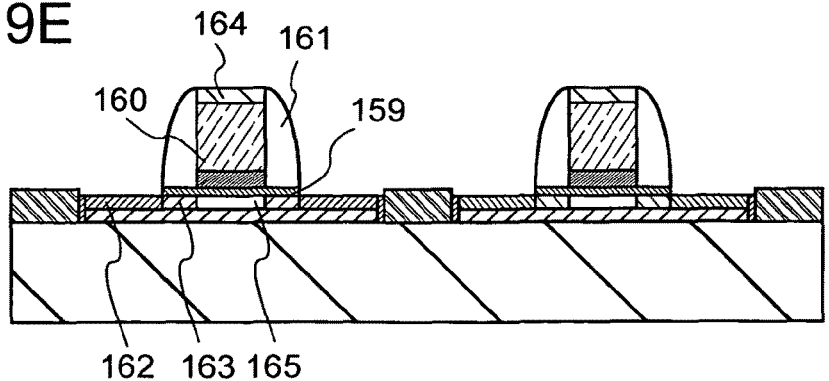

Next, as shown in FIG. 9E, a gate insulating layer 159, a gate electrode 160 having a two-layer structure, a sidewall insulating layer 161, a first impurity region 162, a second impurity region 163, and an insulating layer 164 are formed. By forming the first impurity region 162 and the second impurity region 163 in the semiconductor layer 118, a channel formation region 165 is formed. The insulating layer 164 is formed using silicon nitride and used as a hard mask in etching the gate electrode 160.

Figure 10A:
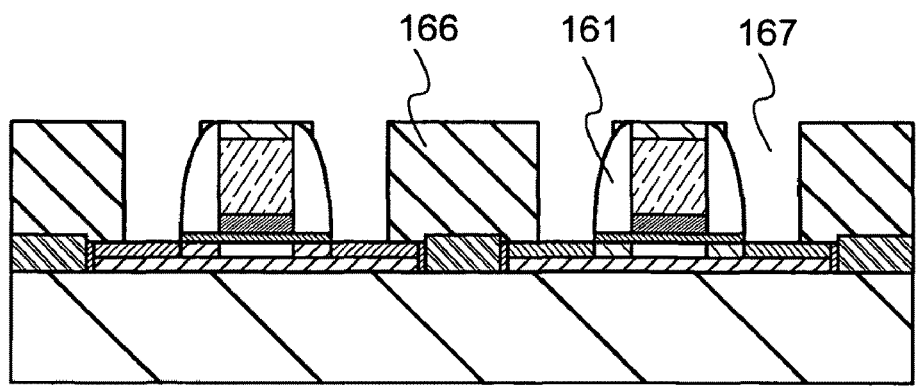
FIGS. 10A and 10B are cross-sectional views illustrating a method for manufacturing a semiconductor device using a semiconductor substrate.

As shown in FIG. 10A, an interlayer insulating layer 166 is formed. As the interlayer insulating layer 166, a BPSG (boron phosphorus silicon glass) film is formed and planarized by reflow. Alternatively, a silicon oxide film may be formed using TEOS and planarized by chemical mechanical polishing treatment. In the planarization treatment, the insulating layer 164 over the gate electrode 160 functions as an etching stopper. A contact hole 167 is formed in the interlayer insulating layer 166. The contact hole 167 has a self-align contact structure utilizing the sidewall insulating layer 161.

Figure 10B:
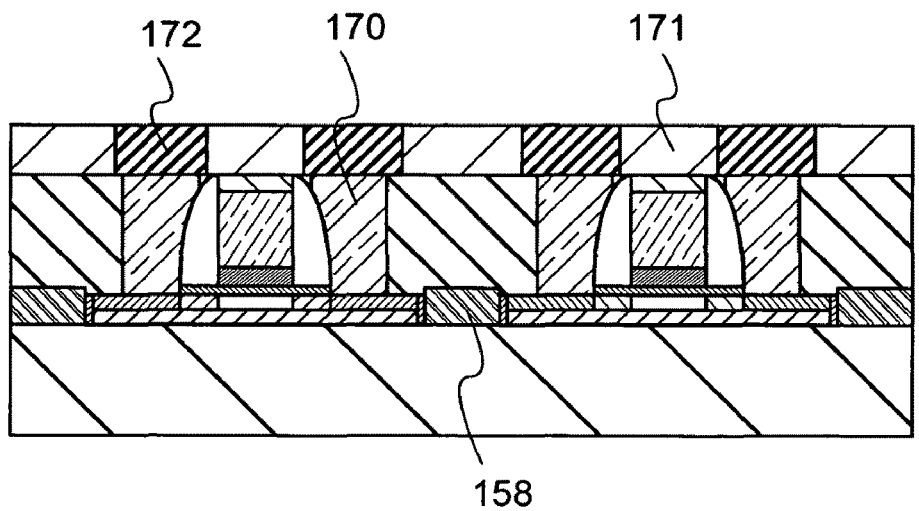

After that, as shown in FIG. 10B, a contact plug 170 is formed using tungsten hexafluoride by a CVD method. Further, an insulating layer 171 is formed; an opening is formed to match the contact plug 170; and a wiring 172 is provided therein. The wiring 172 is formed of aluminum or an aluminum alloy, and is provided with upper and lower metal films of molybdenum, chromium, titanium, or the like as barrier metal films.

In such a manner, a field effect transistor can be manufactured using the semiconductor layer 118 that is bonded to the first substrate 101. Since the semiconductor layer 118 in this embodiment mode includes single crystalline semiconductors with uniform crystal orientation, a uniform field effect transistor with high performance can be obtained. In other words, it is possible to suppress inhomogeneity of values of important transistor characteristics, such as threshold voltage and mobility, and to achieve high performance such as high mobility.

The semiconductor layer 118 is irradiated with laser light to improve planarity of a surface of the semiconductor layer 118; therefore, the interface state density between the channel formation region and the gate insulating layer in the field effect transistor can be lowered. Thus, a field effect transistor provided with excellent characteristics such as low driving voltage, high field effect mobility, and small sub-threshold value can be formed.

Semiconductor devices for various use application can be manufactured using a field effect transistor provided for a substrate for manufacturing a semiconductor. Hereinafter, a specific mode of a semiconductor device is described with reference to drawings.

Figure 11:
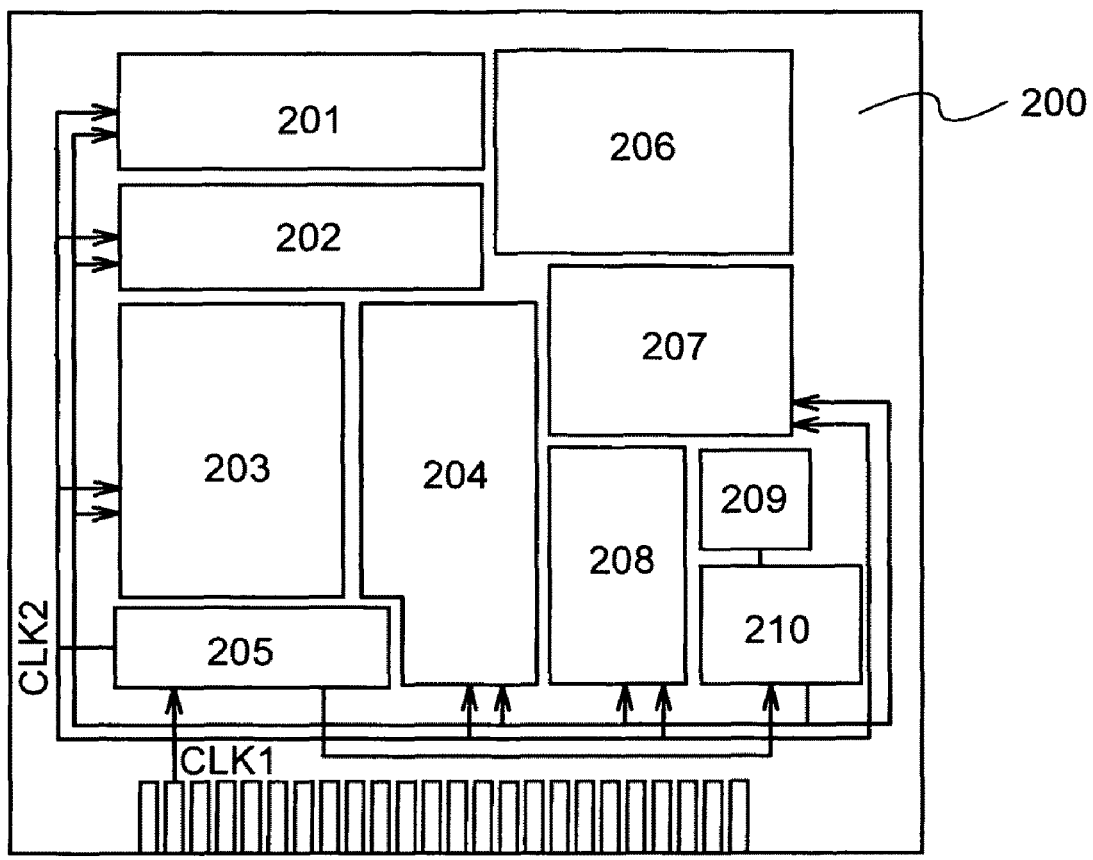
FIG. 11 is a block diagram showing a structure of a microprocessor obtained from a semiconductor substrate.

First, as an example of a semiconductor device, a microprocessor is described. FIG. 11 is a block diagram showing a structural example of a microprocessor 200.

The microprocessor 200 has an arithmetic logic unit (also referred to as ALU) 201, an ALU controller 202, an instruction decoder 203, an interrupt controller 204, a timing controller 205, a register 206, a register controller 207, a bus interface (Bus I/F) 208, a read-only memory (ROM) 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction.

Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207.

For example, the timing controller 205 is provided with an internal clock generator for generating an internal clock signal CLK2 based on a reference clock signal CLK1, and supplies the clock signal CLK2 to the various above-mentioned circuits. Obviously, the microprocessor 200 shown in FIG. 11 is only an example in which the configuration is simplified, and an actual microprocessor may have various configurations depending on the use application.

The above-described microprocessor 200 can achieve not only an increase in processing speed but also a reduction in power consumption because an integrated circuit is formed using a single-crystal semiconductor layer (SOI layer) with uniform crystal orientation which is bonded to a substrate having an insulating surface or an insulating substrate.

Figure 12:
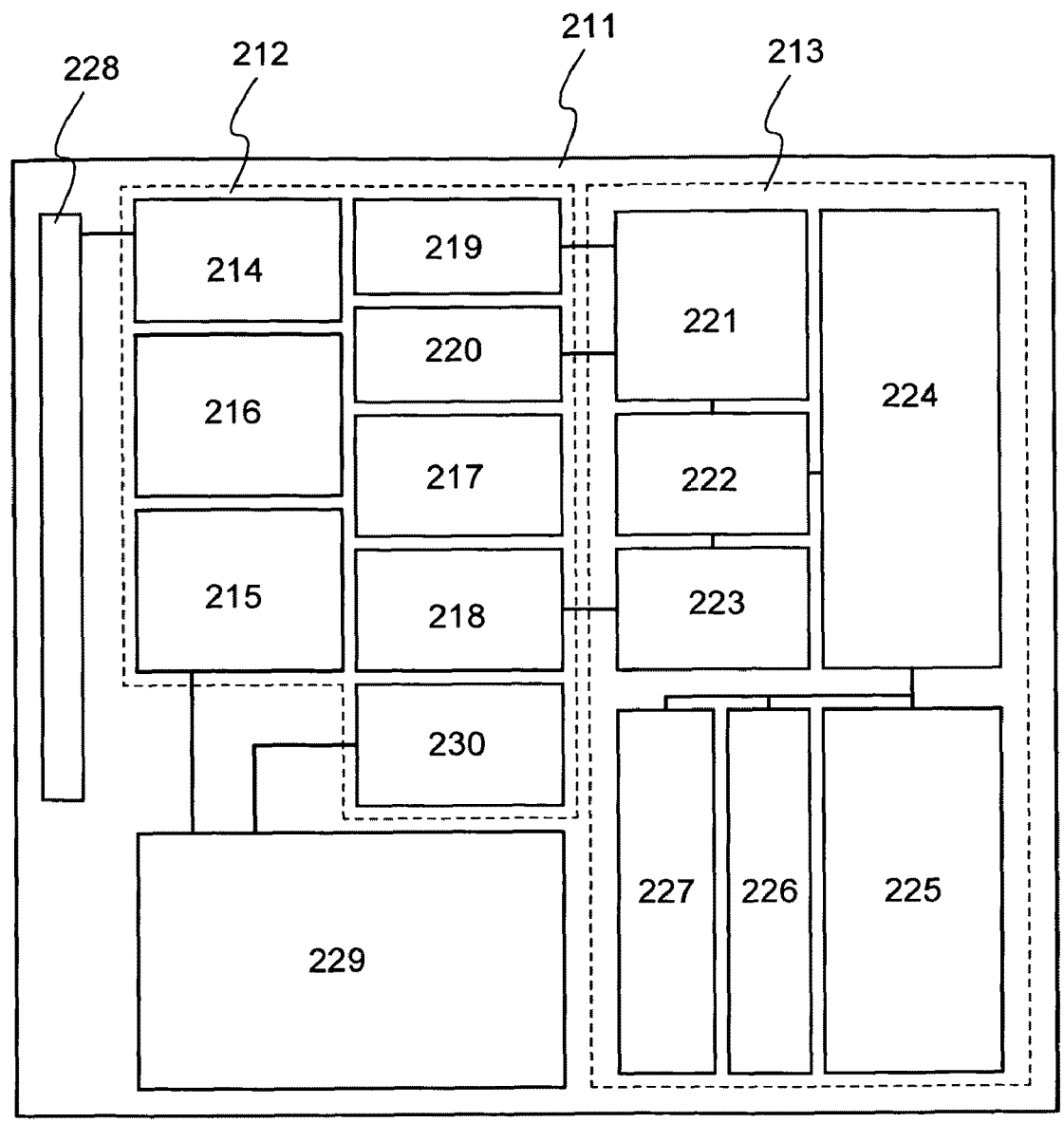
FIG. 12 is a block diagram showing a structure of an RFCPU obtained from a semiconductor substrate.

Next, an example of a semiconductor device provided with a function of transmitting and receiving data wirelessly and an arithmetic function is described. FIG. 12 is a block diagram showing a structural example of such a semiconductor device. A semiconductor device shown in FIG. 12 can be a computer that operates to transmit and receive signals to and from an external device by wireless communication (hereinafter, referred to as an RFCPU).

As shown in FIG. 12, an RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, a modulator circuit 220, and a power management circuit 230. The digital circuit portion 213 has an RF interface 221, a control register 222, a clock controller 223, a CPU interface 224, a central processing unit (CPU) 225, a random-access memory 226, and a read-only memory 227.

The operation of the RFCPU 211 having such a configuration is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and the capacitor portion 229 can be mounted as a different component on a substrate having an insulating surface which is included in the RFCPU 211.

The reset circuit 217 generates a signal for resetting and initializing the digital circuit portion 213. For example, the reset circuit 217 generates a signal which rises after rise in the power supply voltage with delay as a reset signal. The oscillator circuit 218 changes the frequency and duty ratio of a clock signal in response to a control signal generated by the constant voltage circuit 216. The demodulator circuit 219 demodulates a received signal, and the modulator circuit 220 modulates data to be transmitted.

For example, the demodulator circuit 219 is formed using a low-pass filter and binarizes an amplitude-modulated (ASK) received signal based on variation of amplitude. Since the modulator circuit 220 varies the amplitude of an amplitude-modulated (ASK) transmission signal and transmits the data, the modulator circuit 220 changes the amplitude of a communication signal by changing a resonance point of the resonance circuit 214.

The clock controller 223 generates a control signal for changing the frequency and duty ratio of a clock signal in accordance with the power supply voltage or a consumption current of the central processing unit 225. The power supply voltage is managed by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like.

The central processing unit 225 accesses the read-only memory 227, the random-access memory 226, and the control register 222 via the CPU interface 224. The CPU interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing is conducted by a dedicated arithmetic circuit and the other part of the arithmetic processing is conducted by the central processing unit 225 using a program.

The above-described RFCPU 211 can achieve not only an increase in processing speed but also a reduction in power consumption because an integrated circuit is formed using a semiconductor layer with uniform crystal orientation which is bonded to a substrate having an insulating surface or an insulating substrate. This makes it possible to ensure the operation for a long period of time even when the capacitor portion 229 which supplies power is downsized.

Embodiment Mode 10

In this embodiment mode, a method for forming an ion implantation layer will be described.

The formation of the ion implantation layer is conducted by irradiation of a semiconductor substrate with accelerated ions, and the ions are derived from hydrogen (H) (hereafter referred to as "hydrogen ion species"). More specifically, a hydrogen gas or a gas which contains hydrogen in its composition is used as a source gas (a source material); hydrogen plasma is generated by exciting the source gas; and a semiconductor substrate is irradiated with the hydrogen ion species in the hydrogen plasma. In this manner, the ion implantation layer is formed in the semiconductor substrate.

(Ions in Hydrogen Plasma)

In such hydrogen plasma as described above, hydrogen ion species such as $H^+$, $H_2^+$, and $H_3^+$ are present. Here are listed reaction equations for reaction processes (formation processes, annihilation processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H^+ + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 13:
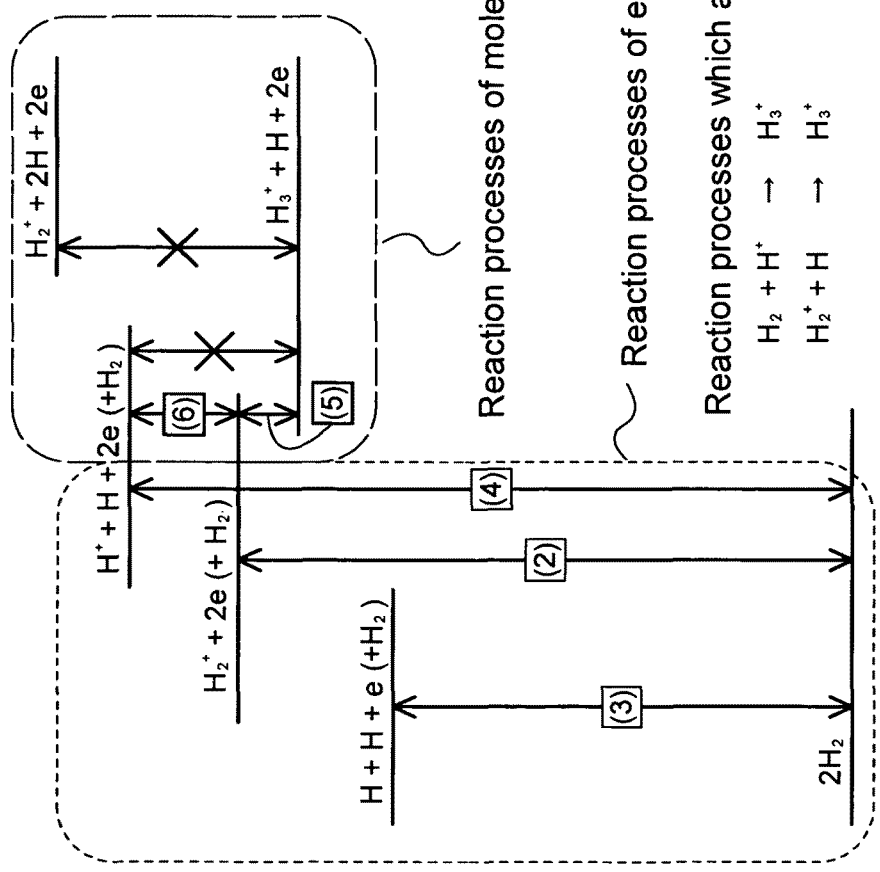
FIG. 13 is an energy diagram of hydrogen ion species.

FIG. 13 is an energy diagram which schematically shows some of the above reactions. Note that the energy diagram shown in FIG. 13 is merely a schematic diagram and does not depict the relationships of energies of the reactions exactly.

[$H_3^+$ Formation Process]

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occurs more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, the following experimentally confirms that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy that is gained by a given charged particle before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high as long as the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high. In the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

[Differences Depending on Ion Source]

Figure 14:
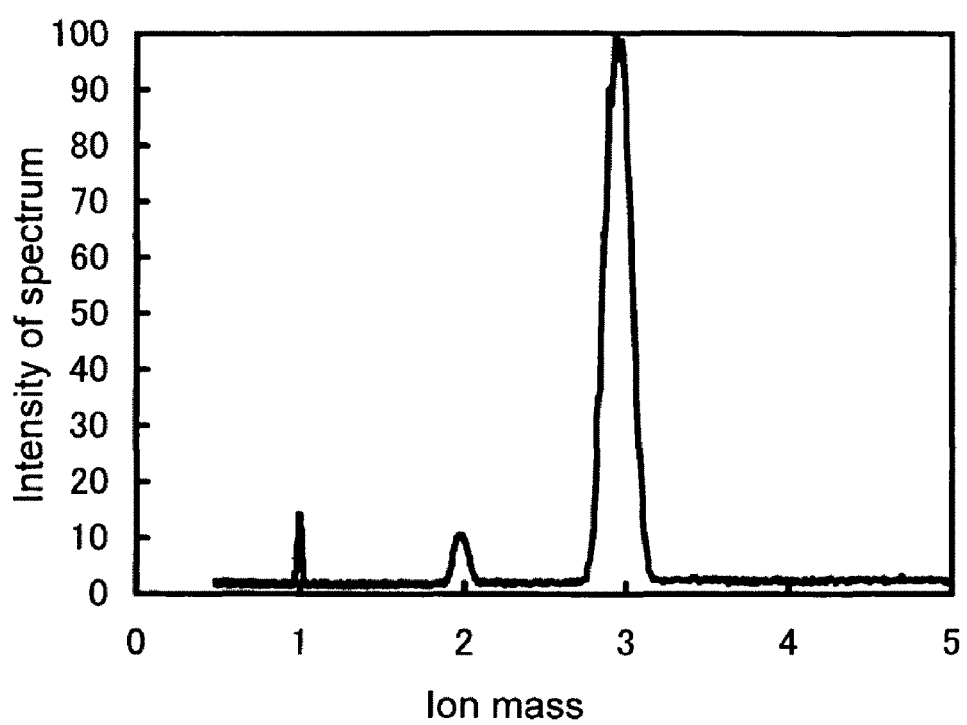
FIG. 14 is a graph showing the results of ion mass spectrometry.

Here, an example, in which the proportions of ion species (particularly, the proportion of $H_3^+$) are different, is described. FIG. 14 is a graph showing the results of mass spectrometry of ions that are generated from a 100% hydrogen gas (with the pressure of an ion source of $4.7 \times 10^{-2}$ Pa). The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 14, the number of ions with different masses is expressed as a relative proportion where the number of ions with a mass of 3 is defined as 100. It can be seen from FIG. 14 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates plasma, an extraction electrode that extracts an ion beam from the plasma, and the like.

Figure 15:
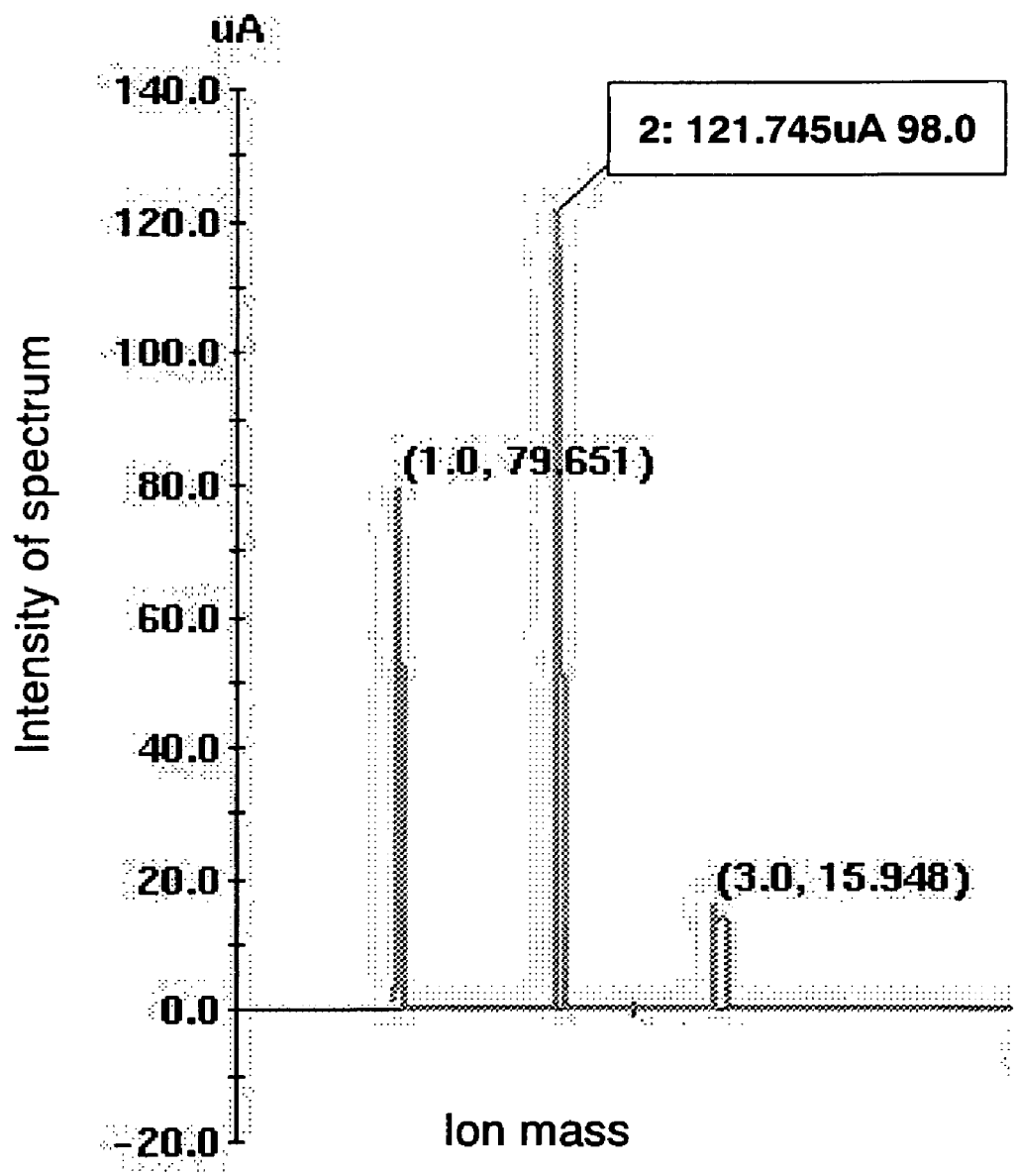
FIG. 15 is a graph showing the results of mass spectrometry of ions.

FIG. 15 is a graph showing the results of mass spectrometry of ions that are generated from $PH_3$ when an ion source different from that for the case of FIG. 14 is used and the pressure of the ion source is about $3 \times 10^{-3}$ Pa. The results of this mass spectrometry focus on the hydrogen ion species. In addition, the mass spectrometry was performed by measurement of ions that have been extracted from the ion source. As in FIG. 14, the horizontal axis of FIG. 15 represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 15 that the ratio between ion species in plasma, i.e., the ratio between $H^+$, $H_2^+$, and $H_3^+$, is about 37:56:7. Note that, although FIG. 15 shows the data obtained when the source gas is $PH_3$, the ratio between the hydrogen ion species is almost the same when a 100% hydrogen gas is used as a source gas, as well.

In the case of the ion source from which the data shown in FIG. 15 is obtained, $H_3^+$, of $H^+$, $H_2^+$, and $H_3^+$, is generated at a proportion of only about 7%. On the other hand, in the case of the ion source from which the data shown in FIG. 14 is obtained, the proportion of $H_3^+$ can be up to 50% or higher (about 80% according to data of FIG. 14). This is thought to result from the pressure and electric field inside a chamber, which is clearly shown in the consideration of [$H_3^+$ Formation Process].

[$H_3^+$ Irradiation Mechanism]

When plasma that contains a plurality of ion species as shown in FIG. 14 is generated and a semiconductor substrate is irradiated with the generated ion species without any mass separation being performed, the surface of the semiconductor substrate is irradiated with each of $H^+$, $H_2^+$, and $H_3^+$ ions. In order to reproduce the mechanism, from the irradiation with ions to the formation of an ion implantation layer, the following five types of models (Models 1 to 5) are considered.

Model 1, where the ion species used for irradiation is $H^+$, which is still $H^+$ (H) after the irradiation.

Model 2, where the ion species used for irradiation is $H_2^+$, which is still $H_2^+$($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$($H_3$) after the irradiation.

Model 5, where the ion species used for irradiation is $H_3^+$, which splits into three H atoms ($H^+$ ions) after the irradiation.

[Comparison of Simulation Results with Measured Values]

Based on the above models 1 to 5, the irradiation of an Si substrate with hydrogen ion species was simulated. As simulation software, SRIM (the Stopping and Range of Ions in Matter) was used. The SRIM is simulation software for ion introduction processes by a Monte Carlo method and is an improved version of TRIM (the Transport of Ions in Matter). Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Simulation results are shown below. In the simulation of this embodiment mode, a calculation based on Model 2 was performed with the $H_2^+$ replaced by $H^+$ that has twice the mass. Furthermore, a calculation based on Model 3 was performed with the $H_2^+$ replaced by $H^+$ that has half the kinetic energy, a calculation based on Model 4 was performed with the $H_3^+$ replaced by $H^+$ that has three times the mass, and a calculation based on Model 5, with the $H_3^+$ replaced by $H^+$ that has one-third the kinetic energy.

Figure 16:
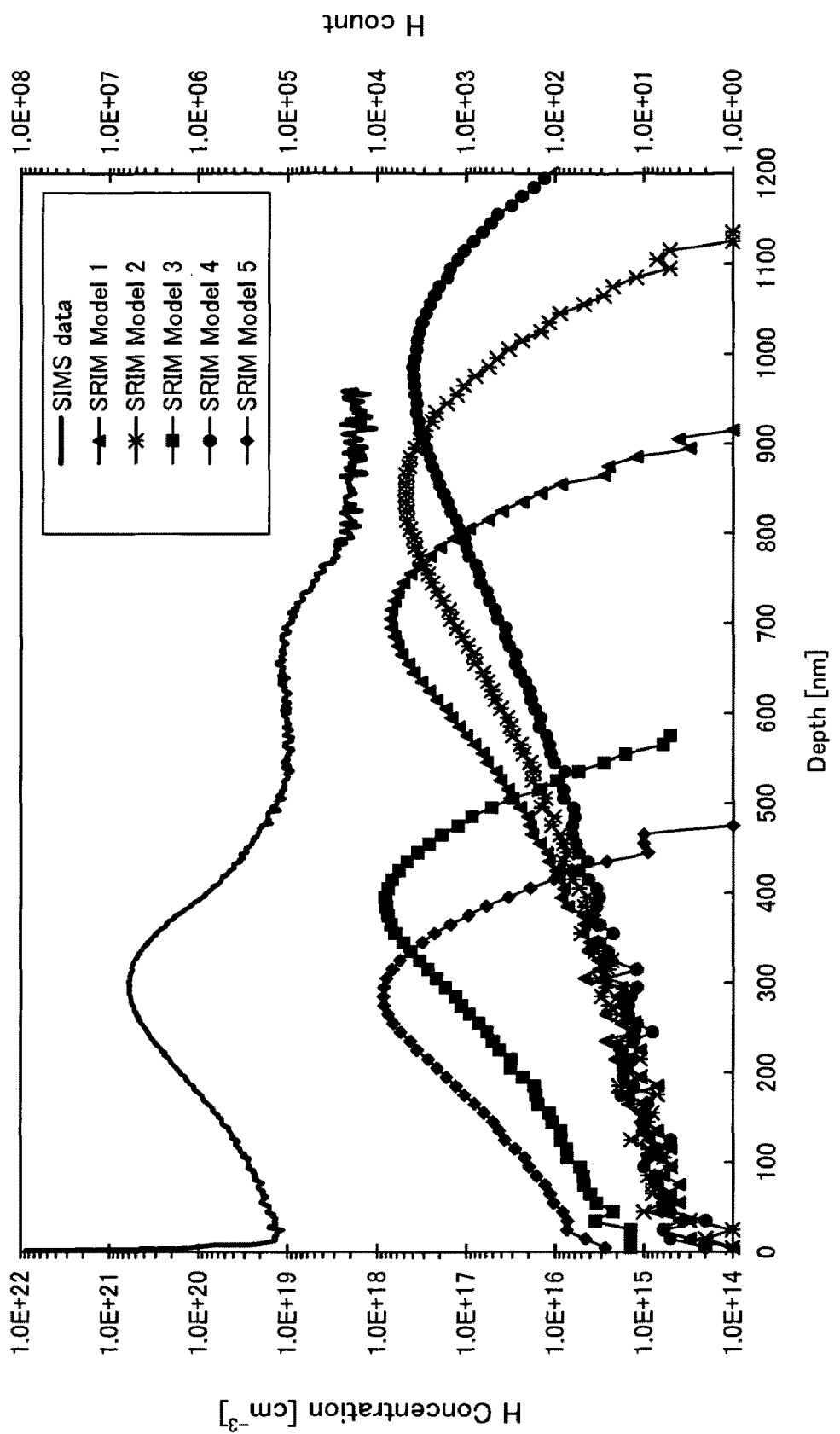
FIG. 16 is a graph showing the profile (calculated values and measured values) of a hydrogen element in a depth direction when an accelerating voltage is 80 kV.

Distribution (Profile) of a hydrogen element (H) in a depth direction was calculated in cases where a Si substrate was irradiated with the hydrogen ion species at accelerating voltage of 80 kV using Models 1 to 5. FIG. 16 shows the calculation results. In FIG. 16, measured values of the distribution in the depth direction of a hydrogen element (H) included in the Si substrate are also shown. The measured values are data measured by SIMS (Secondary Ion Mass Spectroscopy) (hereinafter, referred to as SIMS data). The sample measured by SIMS was a Si substrate which was irradiated with hydrogen ion species ($H^+$, $H_2^+$, $H_3$) produced under the conditions for measuring data of FIG. 14, at accelerating voltage of 80 kV.

In FIG. 16, the vertical axis of the graph of the measured values using the Models 1 to 5 is a right vertical axis showing the number of hydrogen atoms. The vertical axis of the graph of the SIMS data is a left vertical axis showing hydrogen concentration. The horizontal axis of the graph of the measured values and the SIMS data represents a depth from the surface of the Si substrate.

If the SIMS data, which is measured values, is compared with the calculation results, Models 2 and 4 obviously do not match the peaks of the SIMS data in the graph and a peak corresponding to Model 3 cannot be observed in the SIMS data. This shows that the contribution of each of Models 2 to 4 is comparatively smaller than those of Models 1 and 5. Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Accordingly, Models 2 to 4 will not be considered hereinafter. Next, the simulation results are described, obtained when a Si substrate was irradiated with the hydrogen ion species (irradiation with 100,000 atoms for H) at accelerating voltage of 80 kV, 60 kV and 40 kV, using Models 1 and 5.

Figure 17:
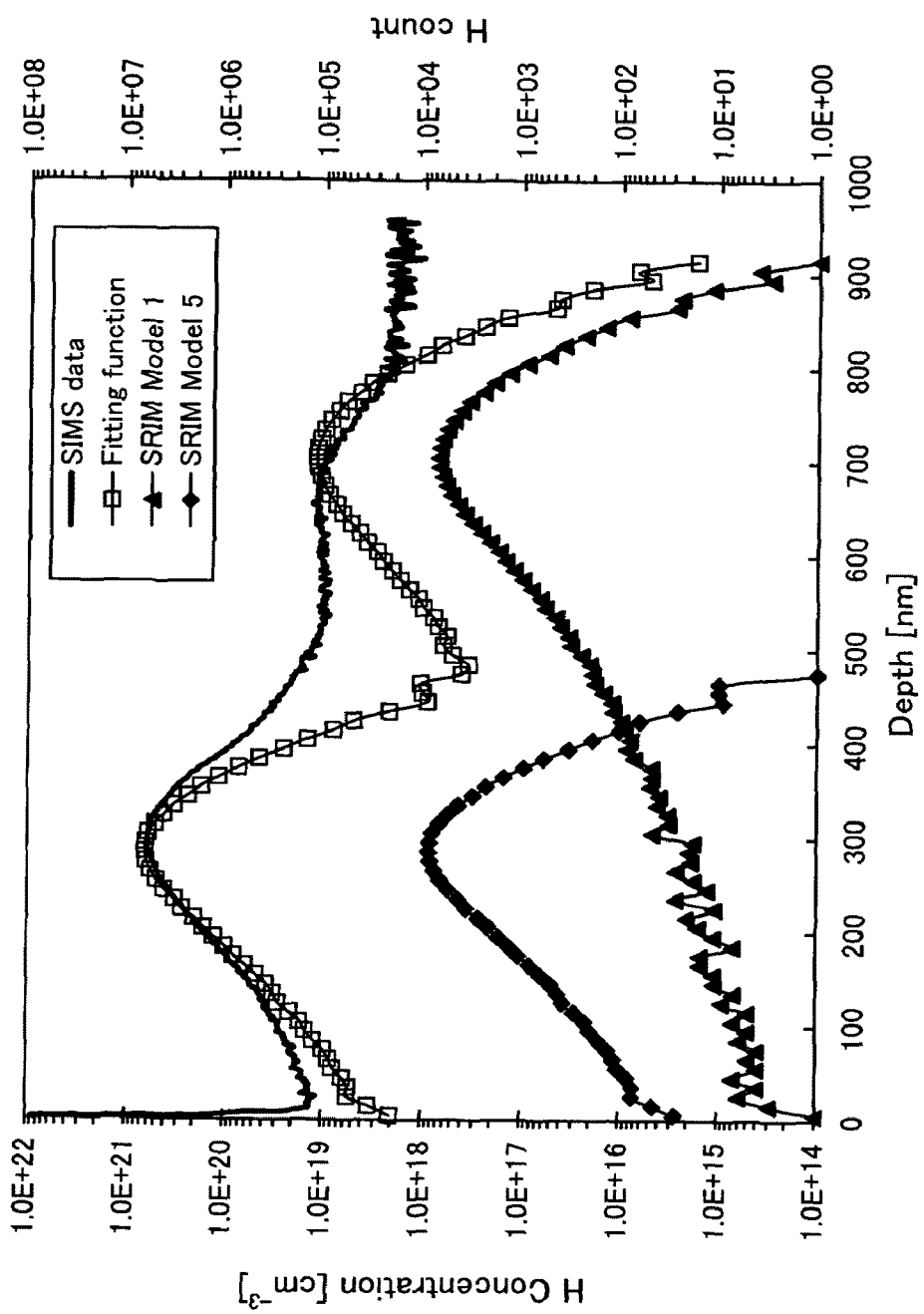
FIG. 17 is a graph showing the profile (calculated values, measured values, and fitting functions) of a hydrogen element in a depth direction when an accelerating voltage is 80 kV.
Figure 18:
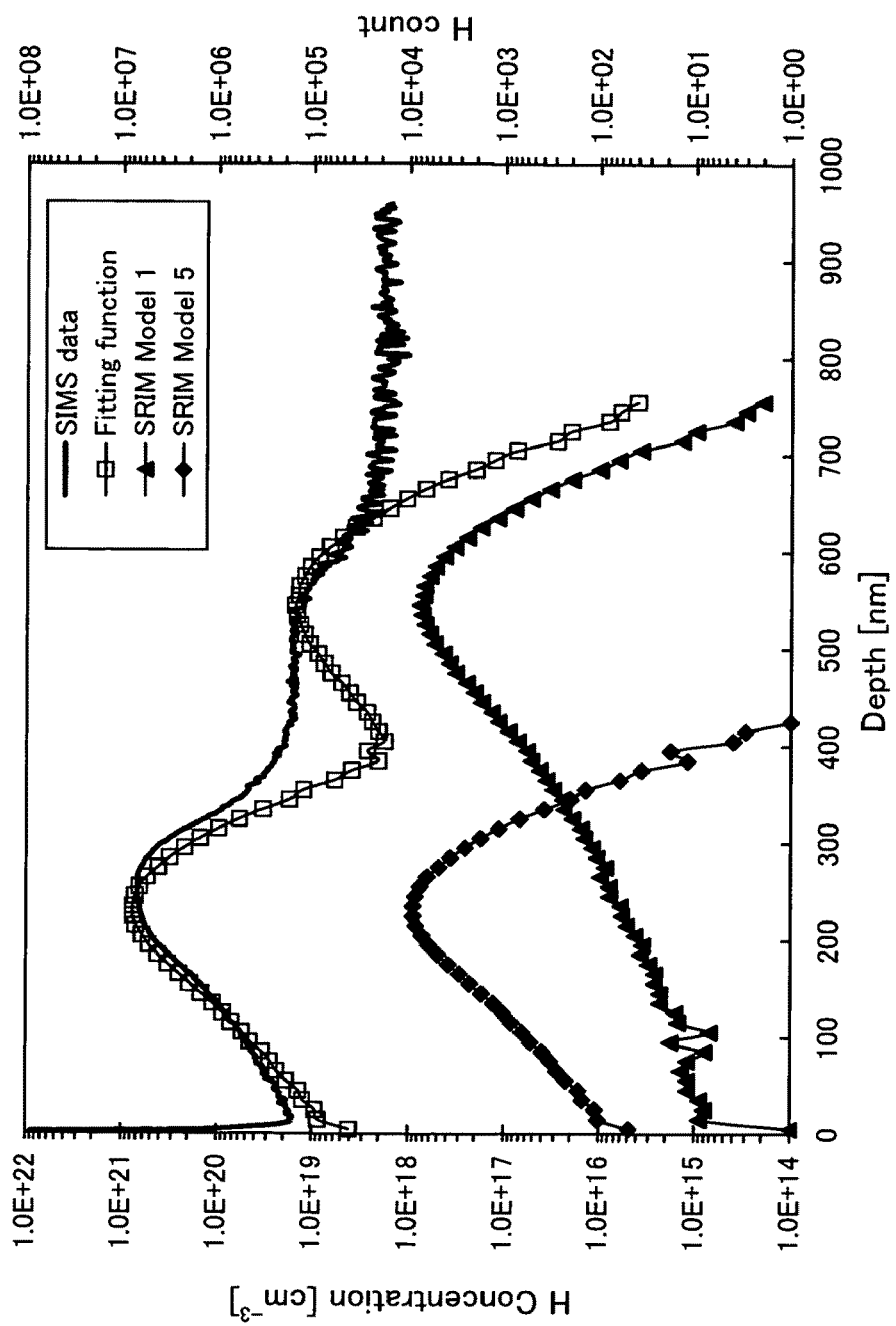
FIG. 18 is a graph showing the profile (calculated values, measured values, and fitting functions) of a hydrogen element in a depth direction when an accelerating voltage is 60 kV.
Figure 19:
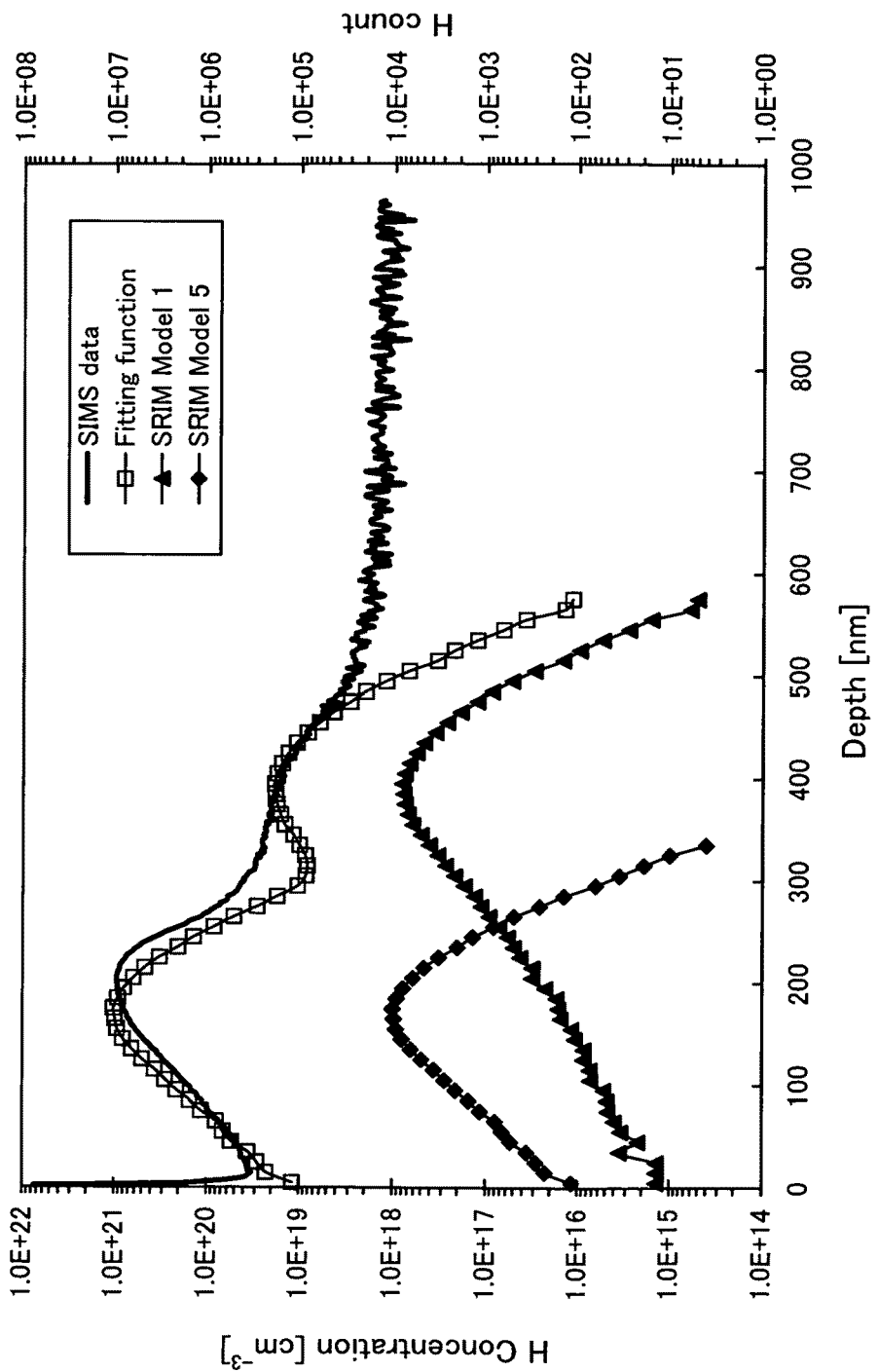
FIG. 19 is a graph showing the profile (calculated values, measured values, and fitting functions) of a hydrogen element in a depth direction when an accelerating voltage is 40 kV.

FIGS. 17 to 19 each show the calculation result in a depth direction of hydrogen (H) included in the Si substrate. FIG. 17 shows the case where the accelerating voltage is 80 kV; FIG. 18, the case where the accelerating voltage is 60 kV; and FIG. 19, the case where the accelerating voltage is 40 kV. Further, in FIGS. 17 to 19, SIMS data as a measured value and a fitting graph to the SIMS data (hereinafter, also referred to as a fitting function) are also shown. The sample measured by SIMS was a Si substrate which was irradiated with hydrogen ion species ($H^+$, $H_2^+$, $H_3^+$) produced under the conditions for measuring data of FIG. 14, at accelerating voltage of 80 kV, 60 kV or 40 kV. Note that the calculation values obtained using Models 1 and 5 are expressed on the vertical axis (right vertical axis) as the number of hydrogen atoms, and the SIMS data and the fitting function are expressed on the vertical axis (left vertical axis) as the concentration of hydrogen atoms. The horizontal axis represents depth from the surface of a Si substrate in the graph.

The fitting function is obtained using the calculation formula (f-1) given below, in consideration of Models 1 and 5. Note that, in the calculation formula (f-1), X and Y represent fitting parameters and V represents volume.

[Fitting Function]=$X/V$×(Data of Model 1)+$Y/V$×(Data of Model 5)   (f-1)

For determining of the fitting function, in consideration of the ratio between ion species used for actual irradiation ($H^+$: $H_2^+$:$H_3^+$ is about 1:1:8, FIG. 14), the contribution of $H_2^+$ (i.e., Model 3) should also be considered; however, the contribution of $H_2^+$ is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak corresponding to Model 3 appears in the SIMS data either, FIG. 16).

The contribution of Model 3 is likely to be obscured by channeling (movement of atoms due to crystal lattice structure) that occurs in the irradiation process of Model 5, because the peak position in the profile in the depth direction of Model 3 is close to that of Model 5 (FIG. 16). That is, it is difficult to estimate fitting parameters for Model 3. This is because this simulation assumes amorphous Si and the influence due to crystallinity is not considered.

FIG. 20 lists the fitting parameters of the calculation formula (f-1). At any of the accelerating voltages, the ratio of the amount of H introduced to the Si substrate according to Model 1 to that introduced according to Model 5 is about 1:42 to 1:45 (the amount of H in Model 5, when the amount of H in Model 1 is defined as 1, is about 42 to 45, inclusive), and the ratio between ion species used for irradiation in the number, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15, inclusive). Considering that Model 3 is not considered and the calculation assumes amorphous Si, it can be said that the ratio shown in FIG. 20 is close to that of the ratio between hydrogen ion species used for actual irradiation ($H^+:H_2^+:H_3^+$ is about 1:1:8, FIG. 14) is obtained.

[Effects of Use of $H_3^+$]

A plurality of benefits resulting from $H_3^+$ can be enjoyed by irradiation of a substrate with hydrogen ion species with a higher proportion of $H_3^+$ as shown in FIG. 14. For example, because $H_3^+$ splits into $H^+$, H, or the like to be introduced into a substrate, ion introduction efficiency can be improved compared with the case of irradiation mainly with $H^+$ or $H_2^+$. This leads to an improvement in a semiconductor substrate production efficiency. In addition, because the kinetic energy of $H^+$ or H after $H_3^+$ splits similarly tends to be low, $H_3^+$ is suitable for manufacture of thin semiconductor layers.

Note that, in this embodiment mode, a method is described in which an ion doping apparatus that is capable of irradiation with the hydrogen ion species as shown in FIG. 14 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, and an increase in area, a reduction in costs, and an improvement in production efficiency of semiconductor substrates can be obtained. On the other hand, if first priority is given to irradiation with $H_3^+$, there is no need to interpret the present invention as being limited to the use of an ion irradiation apparatus.

This application is based on Japanese Patent Application serial no. 2007-125192 filed with Japan Patent Office on May 10, 2007, the entire contents of which are hereby incorporated by reference.

What is claimed is:

1. A method for manufacturing a substrate of a semiconductor device comprising the steps of:
    forming a fragile layer in a semiconductor substrate by irradiating the semiconductor substrate with ion species;
    forming a bonding layer over the semiconductor substrate;
    bonding the semiconductor substrate and a substrate having an insulating surface with the bonding layer interposed therebetween;
    separating the semiconductor substrate with a semiconductor layer left over the substrate having the insulating surface by heating at least the semiconductor substrate;
    thermally oxidizing the semiconductor substrate to form an oxide film over all surfaces of the semiconductor substrate after the separating step; and
    irradiating the semiconductor substrate with laser light after the separating step.

2. The method for manufacturing a substrate of a semiconductor device according to claim 1,
    wherein the ion species are generated by excitation of a source gas containing one or more selected from a hydrogen gas, a rare gas, a halogen gas, and a halogen compound gas.

3. The method for manufacturing a substrate of a semiconductor device according to claim 1,
    wherein the fragile layer is formed by irradiating with $H_3^+$ ions, and wherein the $H_3^+$ ions are mass-separated from hydrogen ions generated from a hydrogen gas.

4. The method for manufacturing a substrate of a semiconductor device according to claim 1,
    wherein the fragile layer is formed by irradiating with an ion beam containing $H^+$ ions, $H_2^+$ ions, and $H_3^+$ ions,
    wherein the ion beam contains the $H_3^+$ ions with a proportion of 70% or more with respect to the total amount of the $H^+$ ions, the $H_2^+$ ions, and the $H_3^+$ ions.

5. The method for manufacturing a substrate of a semiconductor device according to claim 1,
    wherein a silicon oxide film is formed as the bonding layer by a chemical vapor deposition method using an organic silane gas.

6. The method for manufacturing a substrate of a semiconductor device according to claim 1, further comprising a step of forming a barrier layer over the semiconductor substrate before the bonding layer is formed.

7. The method for manufacturing a substrate of a semiconductor device according to claim 1, further comprising a step of forming a second bonding layer over the substrate having the insulating surface before the semiconductor substrate and the substrate having the insulating surface are bonded.

8. The method for manufacturing a substrate of a semiconductor device according to claim 1, further comprising a step of thermally oxidizing the semiconductor substrate to form an oxide film over the semiconductor substrate after the semiconductor substrate is irradiated with laser light.

9. The method for manufacturing a substrate of a semiconductor device according to claim 1,
    wherein the semiconductor substrate is irradiated with laser light in an inert atmosphere.

10. The method for manufacturing a substrate of a semiconductor device according to claim 1,
    wherein the semiconductor substrate is irradiated with laser light in a nitrogen atmosphere.

11. The method for manufacturing a substrate of a semiconductor device according to claim 1,
    wherein the laser light is laser light oscillated from a pulsed laser.

12. A method for manufacturing a substrate of a semiconductor device comprising the steps of:
    forming a fragile layer in a semiconductor substrate by irradiating the semiconductor substrate with ion species;
    forming a bonding layer over the semiconductor substrate;
    bonding the semiconductor substrate and a substrate having an insulating surface with the bonding layer interposed therebetween;
    separating the semiconductor substrate with a semiconductor layer left over the substrate having the insulating surface by heating at least the semiconductor substrate; and thermally oxidizing the semiconductor substrate to form an oxide film over all surfaces of the semiconductor substrate after the separating step.

13. The method for manufacturing a substrate of a semiconductor device according to claim 12,
wherein the ion species are generated by excitation of a source gas containing one or more selected from a hydrogen gas, a rare gas, a halogen gas, and a halogen compound gas.

14. The method for manufacturing a substrate of a semiconductor device according to claim 12,
wherein the fragile layer is formed by irradiating with $H_3^+$ ions, and wherein the $H_3^+$ ions are mass-separated from hydrogen ions generated from a hydrogen gas.

15. The method for manufacturing a substrate of a semiconductor device according to claim 12,
wherein the fragile layer is formed by irradiating with an ion beam containing $H^+$ ions, $H_2^+$ ions, and $H_3^+$ ions,
wherein the ion beam contains the $H_3^+$ ions with a proportion of 70% or more with respect to the total amount of the $H^+$ ions, the $H_2^+$ ions, and the $H_3^+$ ions.

16. The method for manufacturing a substrate of a semiconductor device according to claim 12,
wherein a silicon oxide film is formed as the bonding layer by a chemical vapor deposition method using an organic silane gas.

17. The method for manufacturing a substrate of a semiconductor device according to claim 12, further comprising a step of forming a barrier layer over the semiconductor substrate before the bonding layer is formed.

18. The method for manufacturing a substrate of a semiconductor device according to claim 12, further comprising a step of forming a second bonding layer over the substrate having the insulating surface before the semiconductor substrate and the substrate having the insulating surface are bonded.

19. The method for manufacturing a substrate of a semiconductor device according to claim 12, further comprising a step of irradiating with laser light through the oxide film after the semiconductor substrate is thermally oxidized.

20. The method for manufacturing a substrate of a semiconductor device according to claim 12, further comprising a step of removing the oxide film.

21. The method for manufacturing a substrate of a semiconductor device according to claim 12,
wherein the semiconductor substrate is thermally oxidized in an atmosphere containing halogen.

22. The method for manufacturing a substrate of a semiconductor device according to claim 12,
wherein the semiconductor substrate is thermally oxidized in an atmosphere containing hydrochloric acid.

* * * * *